(12) United States Patent
Simsek-Ege

(10) Patent No.: US 12,308,333 B2
(45) Date of Patent: May 20, 2025

(54) MICROELECTRONIC DEVICES, RELATED ELECTRONIC SYSTEMS, AND METHODS OF FORMING MICROELECTRONIC DEVICES

(71) Applicant: Micron Technology, Inc., Boise, ID (US)

(72) Inventor: Fatma Arzum Simsek-Ege, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 335 days.

(21) Appl. No.: 17/804,247

(22) Filed: May 26, 2022

(65) Prior Publication Data

US 2023/0387055 A1    Nov. 30, 2023

(51) Int. Cl.
| H01L 25/065 | (2023.01) |
| H01L 23/00 | (2006.01) |
| H01L 25/00 | (2006.01) |
| H10B 12/00 | (2023.01) |

(52) U.S. Cl.
CPC .............. *H01L 24/08* (2013.01); *H01L 24/80* (2013.01); *H01L 25/0657* (2013.01); *H01L 25/50* (2013.01); *H10B 12/30* (2023.02); *H10B 12/50* (2023.02); *H01L 2224/08145* (2013.01); *H01L 2224/80896* (2013.01); *H01L 2924/1436* (2013.01)

(58) Field of Classification Search
CPC ..... H01L 24/08; H01L 24/80; H01L 25/0657; H01L 25/50; H01L 2224/08145; H01L 2224/80896; H01L 2924/1436; H01L 2225/06541; H10B 12/30; H10B 12/50; H10B 12/03
See application file for complete search history.

(56) References Cited

U.S. PATENT DOCUMENTS

| 5,901,099 | A | 5/1999 | Gilliam et al. |
| 6,778,452 | B2 | 8/2004 | Beigel et al. |
| 8,067,286 | B2 | 11/2011 | Parekh et al. |
| 8,153,499 | B2 | 4/2012 | Or-Bach et al. |
| 8,184,471 | B2 | 5/2012 | Woo et al. |
| 8,546,188 | B2 | 10/2013 | Liu et al. |
| 8,716,116 | B2 | 5/2014 | Parekh et al. |
| 9,543,433 | B2 | 1/2017 | Anathan et al. |
| 10,366,740 | B1 | 7/2019 | Kim et al. |
| 11,848,309 | B2 | 12/2023 | Simsek-Ege |
| 2014/0347945 | A1 | 11/2014 | Venkata et al. |
| 2019/0244933 | A1 | 8/2019 | Or-Bach et al. |

(Continued)

*Primary Examiner* — Thanh Y. Tran
(74) *Attorney, Agent, or Firm* — TraskBritt

(57) ABSTRACT

A microelectronic device comprises a first microelectronic device structure and a second microelectronic device structure vertically overlying the first microelectronic device structure. The first microelectronic device structure comprises a first memory array region and a first control logic device region configured to effectuate control operations for memory cells of the first memory array region. The second microelectronic device structure comprises a second memory array region and a second control logic device region configured to effectuate control operations for memory cells of the second memory array region. Related memory devices, electronic systems, and methods are also described.

28 Claims, 27 Drawing Sheets

(56) References Cited

U.S. PATENT DOCUMENTS

| | | |
|---|---|---|
| 2020/0066730 A1 | 2/2020 | Guo et al. |
| 2021/0217460 A1 | 7/2021 | Montierth et al. |
| 2022/0399308 A1 | 12/2022 | Simsek-Ege et al. |
| 2023/0018127 A1 | 1/2023 | Gandhi et al. |
| 2023/0207505 A1 | 6/2023 | Simsek-Ege et al. |
| 2023/0389284 A1* | 11/2023 | Simsek-Ege ........... H10B 41/27 |

* cited by examiner

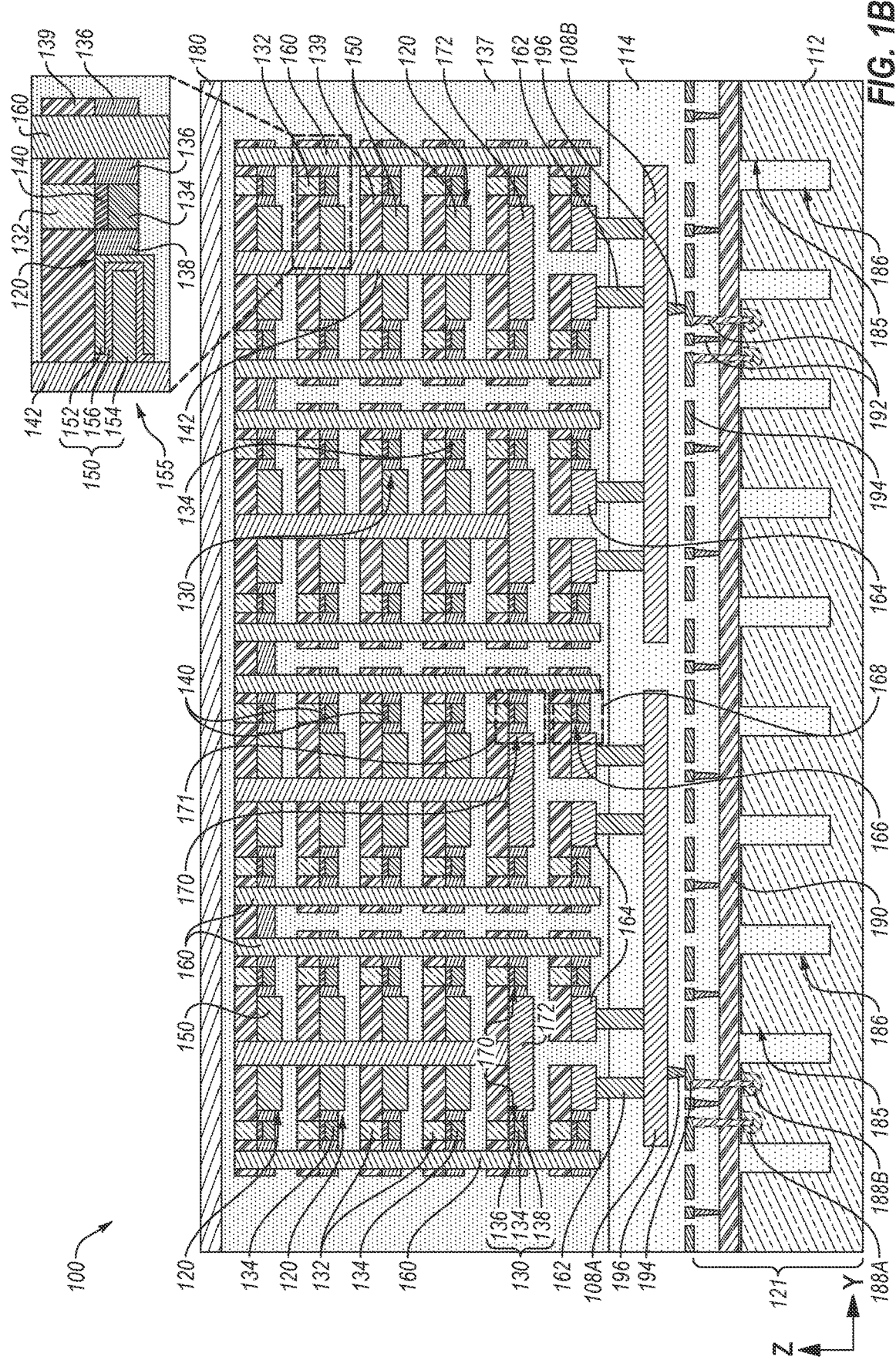

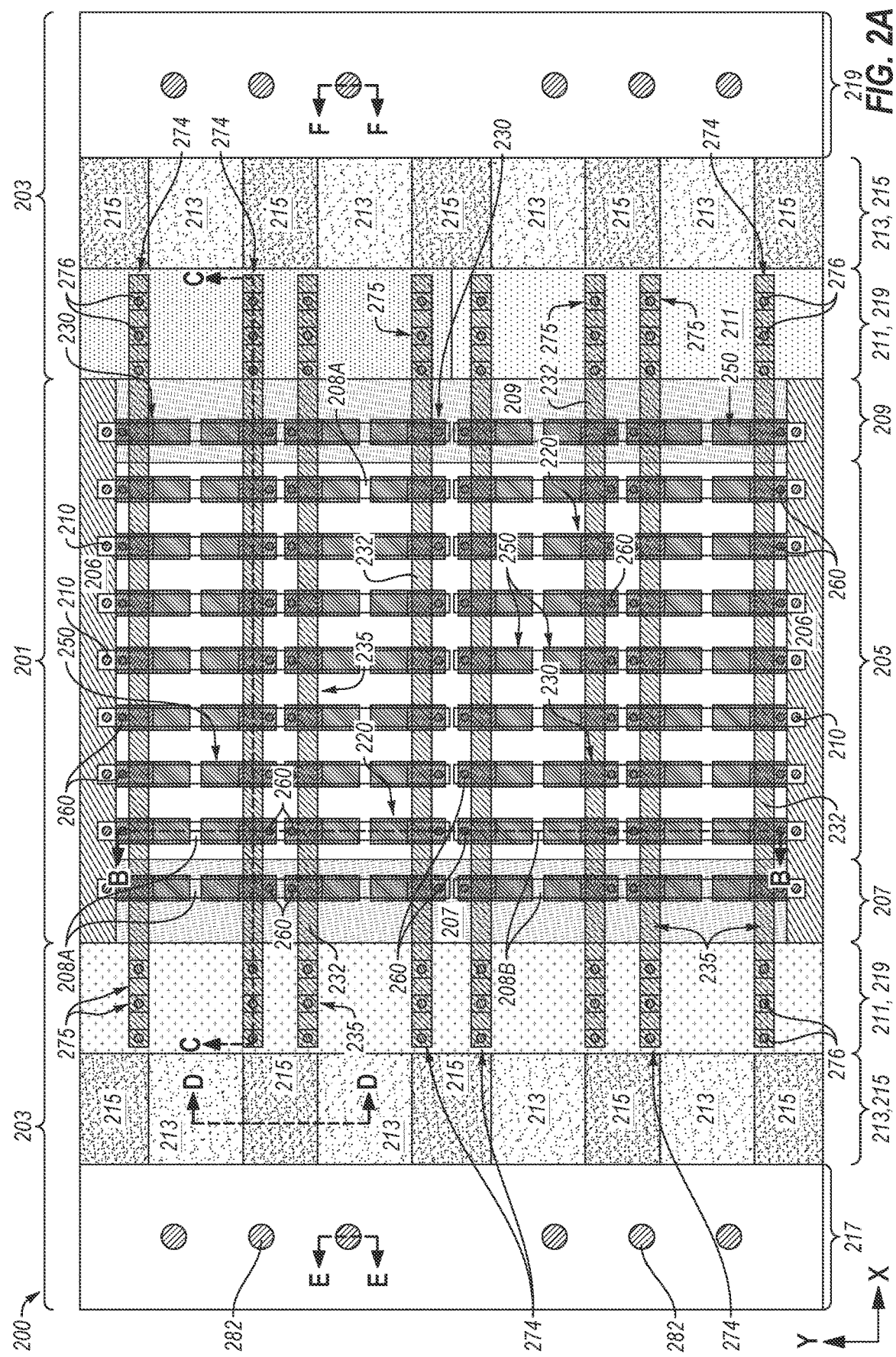

FIG. 3I
FIG. 3J

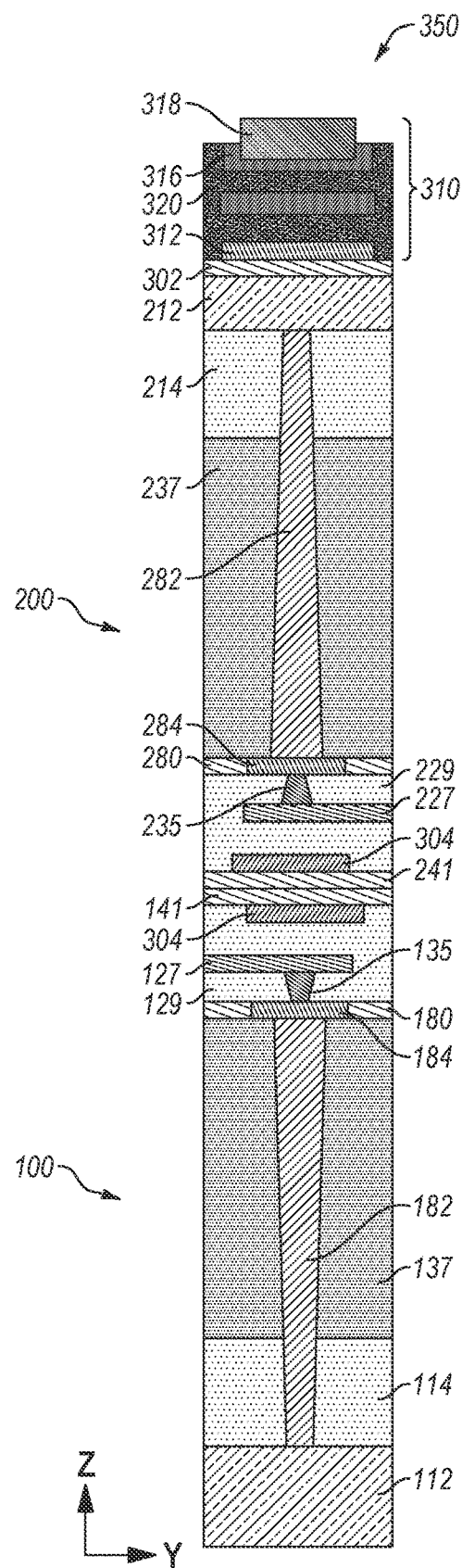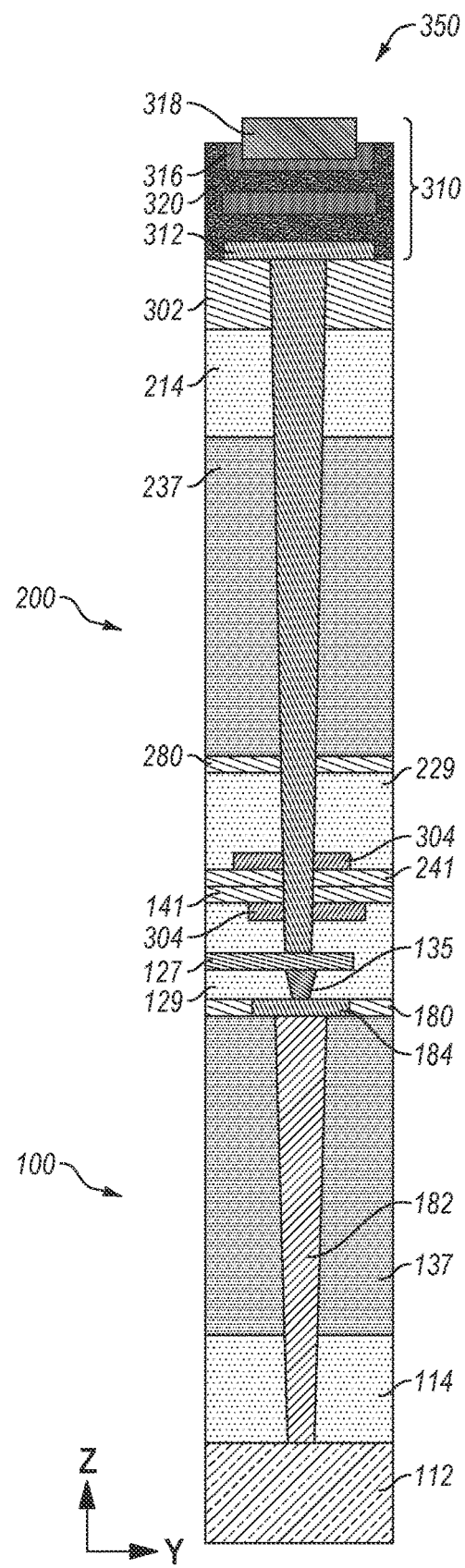
*FIG. 3N*  *FIG. 3O*

MICROELECTRONIC DEVICES, RELATED ELECTRONIC SYSTEMS, AND METHODS OF FORMING MICROELECTRONIC DEVICES

TECHNICAL FIELD

The disclosure, in various embodiments, relates generally to the field of microelectronic device design and fabrication. More specifically, the disclosure relates to methods of forming microelectronic devices from independently formed microelectronic device structures, and to related microelectronic devices and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified designs.

One example of a microelectronic device is a memory device. Memory devices are generally provided as internal integrated circuits in computers or other electronic devices. There are many types of memory devices including, but not limited to, volatile memory devices, such as dynamic random access memory (DRAM) devices; and non-volatile memory devices such as NAND Flash memory devices. A typical memory cell of a DRAM device includes one access device, such as a transistor, and one memory storage structure, such as a capacitor. Modern applications for semiconductor devices can employ significant quantities of memory cells, arranged in memory arrays exhibiting rows and columns of the memory cells. The memory cells may be electrically accessed through digit lines (e.g., bit lines, data lines) and word lines (e.g., access lines) arranged along the rows and columns of the memory cells of the memory arrays. Memory arrays can be two-dimensional (2D) so as to exhibit a single deck (e.g., a single tier, a single level) of the memory cells, or can be three-dimensional (3D) so as to exhibit multiple decks (e.g., multiple levels, multiple tiers) of the memory cells.

Control logic devices within a base control logic structure underlying a memory array of a memory device have been used to control operations (e.g., access operations, read operations, write operations) of the memory cells of the memory device. An assembly of the control logic devices may be provided in electrical communication with the memory cells of the memory array by way of routing and interconnect structures. However, processing conditions (e.g., temperatures, pressures, materials) for the formation of the memory array over the base control logic structure can limit the configurations and performance of the control logic devices within the base control logic structure. In addition, the quantities, dimensions, and arrangements of the different control logic devices employed within the base control logic structure can also undesirably impede reductions to the size (e.g., horizontal footprint) of the memory device, and/or improvements in the performance (e.g., faster memory cell ON/OFF speed, lower threshold switching voltage requirements, faster data transfer rates, lower power consumption) of the memory device. Furthermore, as the density and complexity of the memory array have increased, so has the complexity of the control logic devices. In some instances, the control logic devices consume more real estate than the memory devices, reducing the memory density of the memory device.

BRIEF DESCRIPTION OF THE DRAWINGS

FIG. 1A through FIG. 1K include a simplified, partial top-down view (FIG. 1A) and simplified partial cross-sectional views (FIG. 1B through FIG. 1K) illustrating a first microelectronic device structure, in accordance with embodiments of the disclosure;

FIG. 2A through FIG. 2F include a simplified, partial top-down view (FIG. 2A) and simplified partial cross-sectional views (FIG. 2B through FIG. 2F) illustrating a second microelectronic device structure, in accordance with embodiments of the disclosure;

DETAILED DESCRIPTION

Figure 1A:
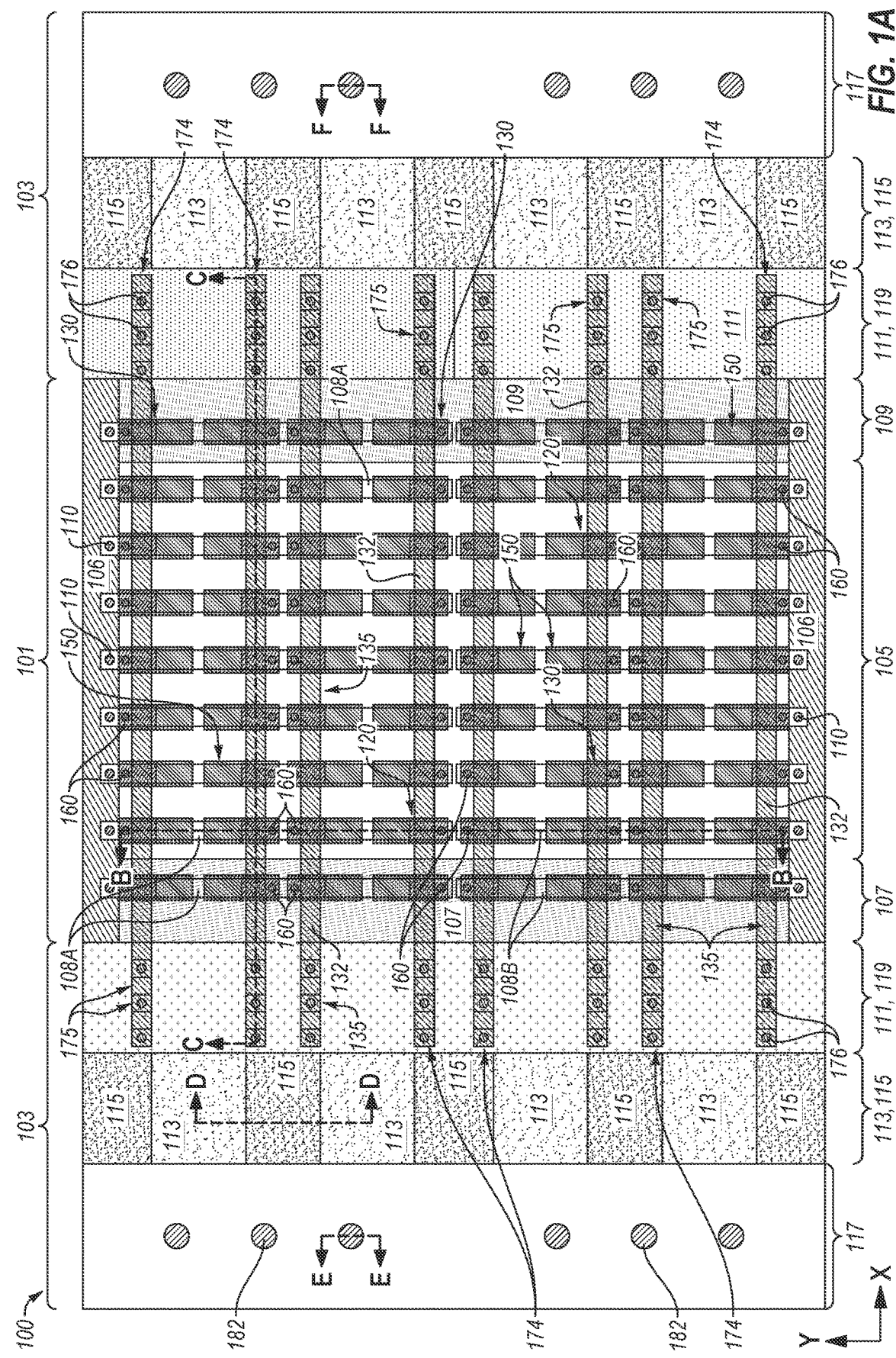

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device (e.g., a semiconductor device, a memory device), apparatus, or electronic system, or a complete microelectronic device, apparatus, or electronic system. The structures described below do not form a complete microelectronic device, apparatus, or electronic system. Only those process acts and structures necessary to understand the embodiments described herein are described in detail below. Additional acts to form a complete microelectronic device, apparatus, or electronic system from the structures may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "memory device" means and includes microelectronic devices exhibiting memory functionality, but not necessarily limited to memory functionality. Stated another way, and by way of example only, the term "memory device" means and includes not only conventional memory (e.g., conventional volatile memory, such as conventional DRAM; conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively doped semiconductor material (e.g., conductively doped polysilicon, conductively doped germanium (Ge), conductively doped silicon germanium (SiGe)). In addition, a "conductive structure" means and includes a structure formed of and including a conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

As used herein, "semiconductor material" or "semiconductive material" refers to a material having an electrical conductivity between those of insulative materials and conductive materials. For example, a semiconductor material may have an electrical conductivity of between about $10^{-8}$ Siemens per centimeter (S/cm) and about $10^4$ S/cm ($10^6$ S/m) at room temperature. Examples of semiconductor materials include elements found in column IV of the periodic table of elements such as silicon (Si), germanium (Ge), and carbon (C). Other examples of semiconductor materials include compound semiconductor materials such as binary compound semiconductor materials (e.g., gallium arsenide (GaAs)), ternary compound semiconductor materials (e.g., $Al_xGa_{1-x}As$), and quaternary compound semiconductor materials (e.g., $Ga_xIn_{1-x}As_yP_{1-y}$), without limitation. Compound semiconductor materials may include combinations of elements from columns III and V of the periodic table of elements (III-V semiconductor materials) or from columns II and VI of the periodic table of elements (II-VI semiconductor materials), without limitation. Further examples of semiconductor materials include oxide semiconductor materials such as zinc tin oxide ($Zn_xSn_yO$, commonly referred to as "ZTO"), indium zinc oxide ($In_xZn_yO$, commonly referred to as "IZO"), zinc oxide ($Zn_xO$), indium gallium zinc oxide ($In_xGa_yZn_zO$, commonly referred to as "IGZO"), indium gallium silicon oxide ($In_xGa_ySi_zO$, commonly referred to as "IGSO"), indium tungsten oxide ($In_xW_yO$, commonly referred to as "IWO"), indium oxide ($In_xO$), tin oxide ($Sn_xO$), titanium oxide ($Ti_xO$), zinc oxide nitride ($Zn_xON_z$), magnesium zinc oxide ($Mg_xZn_yO$), zirconium indium zinc oxide ($Zr_xIn_yZn_zO$), hafnium indium zinc oxide ($Hf_xIn_yZn_zO$), tin indium zinc oxide ($Sn_xIn_yZn_zO$), aluminum tin indium zinc oxide ($Al_xSn_yIn_zZn_aO$), silicon indium zinc oxide ($Si_xIn_yZn_zO$), aluminum zinc tin oxide ($Al_xZn_ySn_zO$), gallium zinc tin oxide ($Ga_xZn_ySn_zO$), zirconium zinc tin oxide ($Zr_xZn_ySn_zO$), and other similar materials.

According to embodiments described herein, a microelectronic device includes a microelectronic device includes a first microelectronic device structure including vertical stacks of memory cells and a first control logic device region including control logic devices and circuitry configured to effectuate control operations for the vertical stacks of memory cells of the first microelectronic device structure; and a second microelectronic device structure vertically overlying the first microelectronic device structure and including additional vertical stacks of memory cells a second control logic device region including control logic devices and circuitry configured to effectuate control operations for the additional vertical stacks of memory cells of the second microelectronic device structure. Each of the first microelectronic device structure and the second microelectronic device structure individually includes additional complementary metal-oxide-semiconductor (CMOS) devices and circuitry for effectuating control operations of the microelectronic device (e.g., in addition to the control logic devices of the first control logic device region and the control logic devices of the second control logic device region).

Forming the microelectronic device to include the first microelectronic device structure including the vertical stacks of memory cells and the first control logic device region; and the second microelectronic device structure including the additional vertical stacks of memory cells and the second control logic device region vertically stacked over the first microelectronic device structure may facilitate forming the microelectronic device to exhibit a reduced horizontal area (e.g., footprint) and an increased memory density compared to conventional microelectronic devices. For example, the vertical stacks of memory cells of the first microelectronic device structure and additional vertical stacks of memory cells of the second microelectronic device structure may be formed to include a greater number of levels of memory cells compared to conventional microelectronic devices.

FIG. 1A through FIG. 1F are a simplified partial top-down view (FIG. 1A) and simplified partial cross-sectional views (FIG. 1B through FIG. 1F) illustrating a first microelectronic device structure 100 (e.g., a memory device, such as a 3D DRAM memory device), in accordance with embodiments of the disclosure. With the description provided below, it will be readily apparent to one of ordinary skill in the art that the methods and structures described herein with reference to FIG. 1A through FIG. 1F may be used in various devices and electronic systems. The first microelectronic device structure 100 may also be referred to herein as a first die or a first wafer.

Figure 1C:
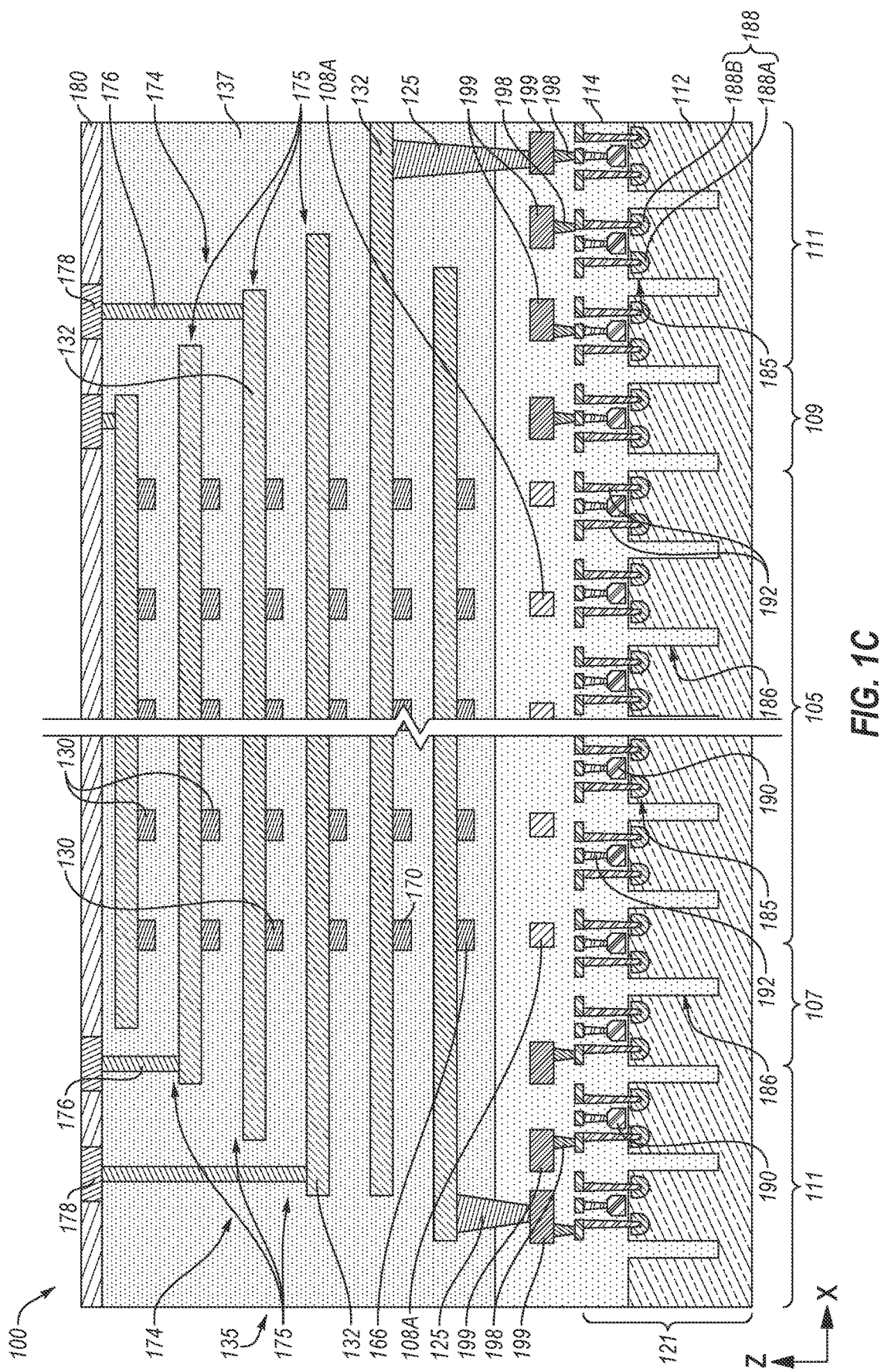
Figure 1D:
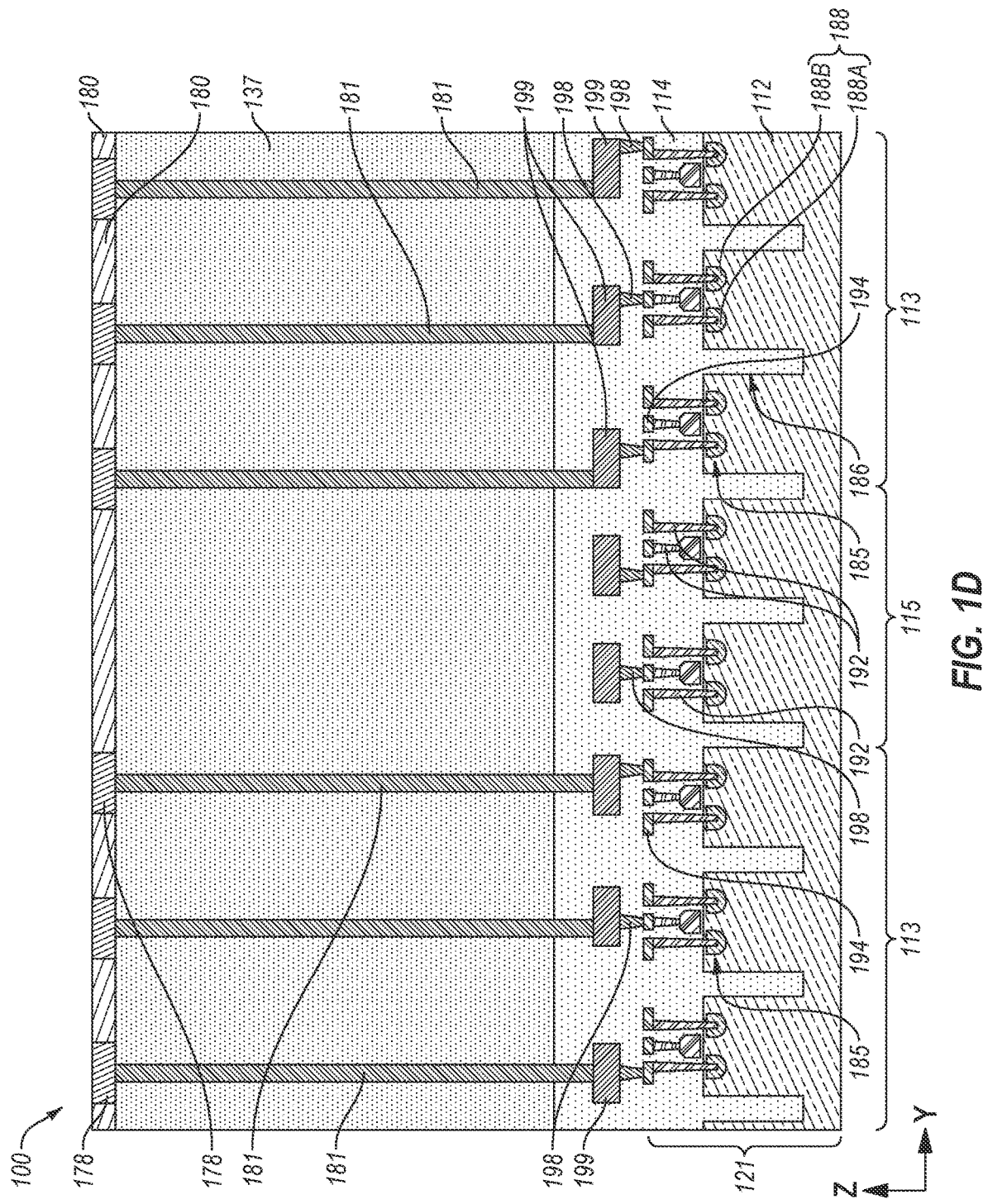
Figure 1E:
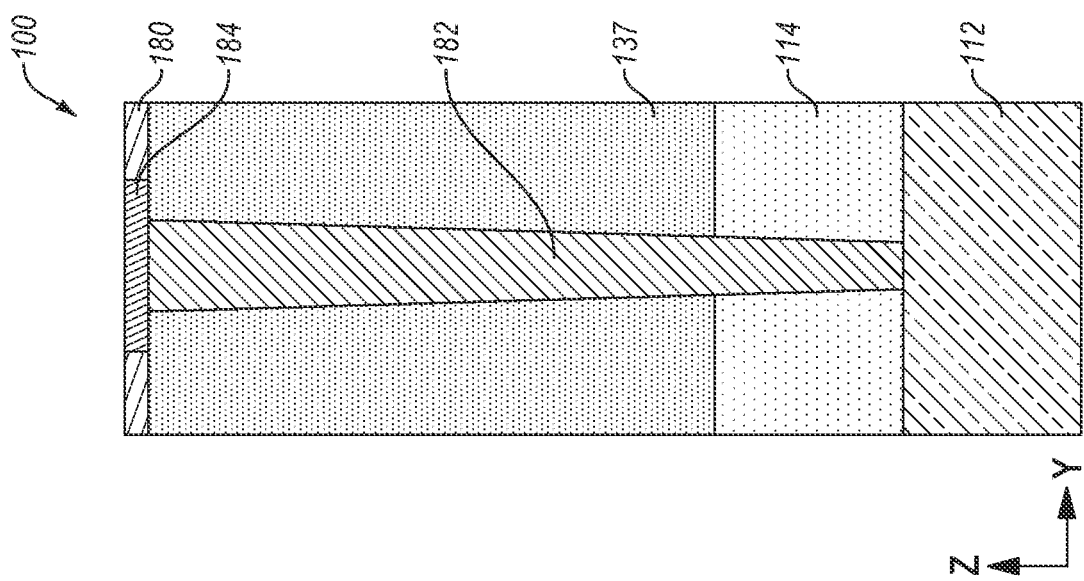
Figure 1F:
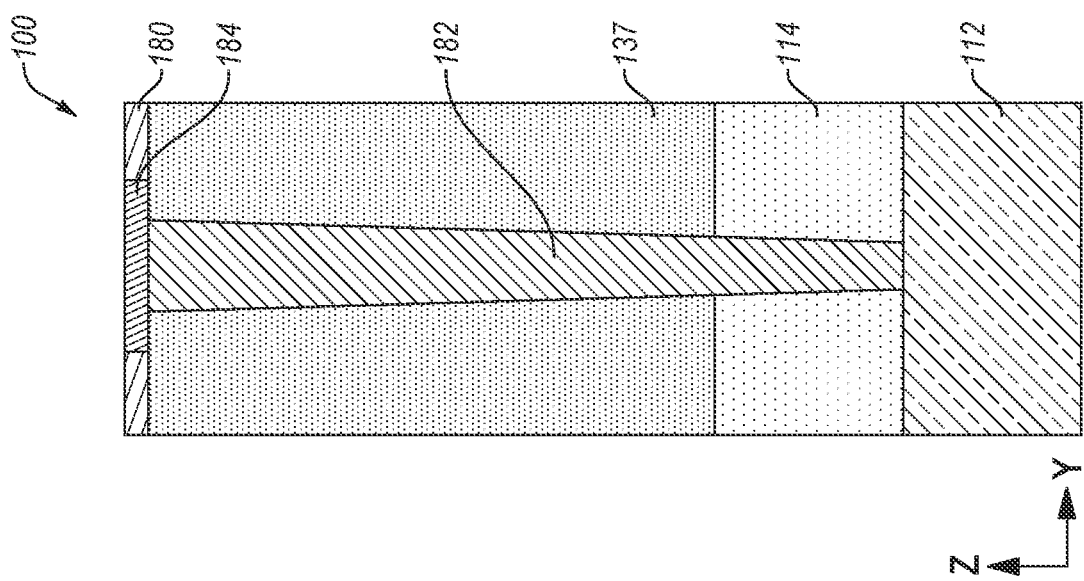

FIG. 1A is a simplified partial top-down view of the first microelectronic device structure 100; FIG. 1B is a simplified partial cross-sectional view of the first microelectronic device structure 100 taken through section line B-B of FIG. 1A; FIG. 1C is a simplified partial cross-sectional view of the first microelectronic device structure 100 taken through section line C-C of FIG. 1A; FIG. 1D is a simplified partial cross-sectional view of the first microelectronic device structure 100 taken through section line D-D of FIG. 1A; FIG. 1E is a simplified partial cross-sectional view of the first microelectronic device structure 100 taken through section line E-E of FIG. 1A; and FIG. 1F is a simplified partial cross-sectional view of the first microelectronic device structure 100 taken through section line F-F of FIG. 1A.

Referring to FIG. 1A, the first microelectronic device structure 100 includes a first array region 101 (also referred to herein as a "first memory array region") and one or more peripheral regions 103 located external to the first array region 101. In some embodiments, the peripheral regions 103 horizontally (e.g., in at least X-direction) surround the first array region 101. In some embodiments, the peripheral regions 103 substantially surround all horizontal sides of the first array region 101 in a first horizontal direction (e.g., the X-direction). In other embodiments, the peripheral regions 103 substantially surround all horizontal boundaries (e.g., an entire horizontal area) of the first array region 101.

The first array region 101 may include, for example, a first sense amplifier device region 105, a first column decoder region 107, and a first sense amplifier driver region 109. The first column decoder region 107 may horizontally neighbor (e.g., in the X-direction) the first sense amplifier device region 105; and the first sense amplifier driver region 109 may horizontally neighbor (e.g., in the X-direction) the first sense amplifier device region 105 opposite the first column decoder region 107. In some embodiments, the first sense amplifier device region 105 horizontally intervenes (e.g., in the X-direction) between the first column decoder region 107 and the first sense amplifier driver region 109.

The peripheral regions 103 may include, for example, one or more first multiplexer controller regions 111, one or more first sub word line driver regions 113, one or more first row decoder device regions 115, and one or more first complementary metal-oxide-semiconductor (CMOS) device and socket regions 117. In some embodiments, one of the first multiplexer controller regions 111 horizontally neighbors (e.g., in the X-direction) the first column decoder region 107 and an additional one of the first multiplexer controller regions 111 horizontally neighbors (e.g., in the X-direction) the first sense amplifier driver region 109. In some embodiments, the first multiplexer controller regions 111 are substantially coextensive (e.g., in the Y-direction) with one or more of (e.g., each of) the first sense amplifier device region 105, the first column decoder region 107, and the first sense amplifier driver region 109.

The first sub word line driver regions 113 and the first row decoder device regions 115 each individually horizontally neighbors (e.g., in the X-direction) one of the first multiplexer controller regions 111 and one of the first CMOS device and socket regions 117. In some embodiments, the sub word line driver regions 113 and the first row decoder device regions 115 horizontally intervene (e.g., in the X-direction) between one of the first multiplexer controller regions 111 and one of the first CMOS device and socket regions 117. In some embodiments, each of the first sub word line driver regions 113 horizontally neighbors (e.g., in the Y-direction) at least one of the first row decoder device regions 115 and at least some of the first sub word line driver regions 113 horizontally intervene (e.g., in the Y-direction) between two of the first row decoder device regions 115. In some embodiments, each of the first row decoder device regions 115 horizontally neighbors (e.g., in the Y-direction) at least one of the first sub word line driver regions 113 and at least some of the first row decoder device regions 115 horizontally intervene (e.g., in the Y-direction) between two of the first sub word line driver regions 113.

As described in further detail herein, in some embodiments, the first row decoder device regions 115 horizontally neighbor (e.g., in the X-direction) staircase structures 174, such that the staircase structures 174 are located within horizontal boundaries (e.g., in the Y-direction) of the first row decoder device regions 115. In some embodiments, the sub word line driver regions 113 are horizontally offset (e.g., in the X-direction, in the Y-direction) from the staircase structures 174. As described in further detail herein, contact structures (e.g., first conductive contact structures 176 (FIG. 1C)) of the staircase structures 174 are routed from the staircase structures 174 to the sub word line driver regions 113.

The first CMOS device and socket regions 117 may horizontally neighbor (e.g., in the X-direction) the first sub word line driver regions 113 and the first row decoder device regions 115. In some embodiments, the first CMOS device and socket regions 117 are located at horizontally terminal ends (e.g., in the X-direction) of the peripheral regions 103.

The first sense amplifier device region 105 may include, for example, one or more of equalization (EQ) amplifiers, isolation (ISO) amplifiers, NMOS sense amplifiers (NSAs) (also referred to as N sense amplifiers), and PMOS sense amplifiers (PSAs) (also referred to as P sense amplifiers). As will be described in further detail herein, the devices and circuitry (e.g., sense amplifiers) of the first sense amplifier device region 105 may be coupled to global digit lines 108 within the first array region 101 for effectuating one or more control operations of memory cells (e.g., memory cells 120 (FIG. 1B)) of the first array region 101.

In some embodiments, the first sense amplifier device region 105 includes column select devices configured for effectuating one or more control operations of memory cells (e.g., memory cells 120 (FIG. 1B)) within the first array region 101. In some such embodiments, the column select devices are configured to send a column address signal to a bit line (e.g., conductive pillar structures 160 (FIG. 1B)) to selectively access desired memory cells within the first array region 101 for effectuating one or more control operations of the memory cells. The column select devices may be configured to be electrically coupled to sense amplifier devices of the first sense amplifier device region 105 with local input/output devices.

The first column decoder region 107 may include column decoder devices configured to receive, for example, an address signal from an address decoder or from an input/output device of the input/output (I/O) device or a device located within the first CMOS device and socket regions 117 and send a column select signal to a column select device (e.g., located within the first sense amplifier device region 105) or to a multiplexer driver device within one of the first multiplexer controller regions 111.

The first sense amplifier driver region 109 may include NMOS sense amplifier drivers (RNL) and PMOS sense amplifier drivers (ACT). The NMOS sense amplifier drivers may generate, for example, activation signals for driving the NMOS sense amplifiers of the first sense amplifier device region 105 and the PMOS sense amplifier drivers may generate, for example, activation signals for driving the PMOS sense amplifiers of the first sense amplifier device region 105. By way of non-limiting example, NMOS sense amplifier drivers generate a low potential (e.g., ground) activation signal for activating an NMOS sense amplifier of the first sense amplifier device region 105 and the PMOS sense amplifier drivers generate a high potential (e.g., $V_{cc}$) activation signal for activating a PMOS sense amplifier of the first sense amplifier device region 105. However, the disclosure is not so limited and the NMOS sense amplifier drivers and the PMOS sense amplifier drivers may generate sense amplifier activation signals other than those described.

The first multiplexer controller regions 111 may include multiplexer control devices configured for effectuating operation of multiplexers (e.g., multiplexers 166 (FIG. 1B through FIG. 1D)) within the first array region 101. For example, the first multiplexer controller regions 111 may include select devices (e.g., transistors) for selectively providing a current to multiplexers within the first array region 101. As described in further detail herein, in some embodiments, the multiplexers may be configured to receive a signal (e.g., a select signal) from the first multiplexer controller regions 111 and provide the signal to a bit line (e.g., conductive pillar structures 160 (FIG. 1B)) to selectively access desired memory cells within the first array region 101 for effectuating one or more control operations of the memory cells.

Each of the first sub word line driver regions 113 may individually include sub word line drivers in electrical communication with the memory cells 120 (FIG. 1B) of the first microelectronic device structure 100 (FIG. 1). As will be described in further detail herein, the sub word line drivers of the first sub word line driver regions 113 may be in electrical communication with conductive structures (e.g., conductive structures 132, also referred to as "word lines" 132) of the stack structures 135.

Each of the first row decoder device regions 115 may be in electrical communication with sub word line drivers of one or more of the first sub word line driver regions 113. Each of the first row decoder device regions 115 may include row decoder devices individually configured to receive an address signal from, for example, an address decoder.

The first CMOS device and socket regions 117 may include one or more control logic devices configured for effectuating control operations of one or more of the memory cells 120 of the first microelectronic device structure 100, one or more (e.g., each) of charge pumps (e.g., $V_{CCP}$ charge pumps, $V_{NEGWL}$ charge pumps, DVC2 charge pumps), decoupling capacitors, voltage generators, power supply terminals, drain supply voltage ($V_{DD}$) regulators, decoders (e.g., local deck decoders), repair circuitry (e.g., column repair circuitry, row repair circuitry), memory test devices, array multiplexers (MUX) (e.g., in addition to multiplexers of the first multiplexer controller regions 111), and error checking and correction (ECC) devices, self-refresh/wear leveling devices, page buffers, data paths, I/O devices (e.g., local I/O devices) and controller logic (timing circuitry, clock devices (e.g., a global clock device)), deck enable, read/write circuitry, address circuitry, or other logic devices and circuitry, and various chip/deck control circuitry. In some embodiments, the first CMOS device and socket regions 117 include one or more capacitor structures, such as one or more decoupling capacitors. The first CMOS device and socket regions 117 may also include interconnect structures for electrically connecting components of the first microelectronic device structure 100 to a second microelectronic device structure (e.g., second microelectronic device structure 200) (e.g., to input/output devices of the second microelectronic device structure) and to BEOL structures of the second microelectronic device structure.

The first CMOS device and socket regions 117 may include electrically conductive interconnects to electrically connect circuitry of the first microelectronic device structure 100 to a second microelectronic device structure (e.g., second microelectronic device structure 200) (e.g., to input/output devices of the second microelectronic device structure) and to BEOL structures of the second microelectronic device structure.

In some embodiments, the first CMOS device and socket regions 117 further include input/output (I/O) devices configured for effectuating operation of a microelectronic device (e.g., microelectronic device 350 (FIG. 3K through FIG. 3O)). The one or more input/output devices may be coupled to, for example, a back end of line (BEOL) structure of the microelectronic device.

Figure 2B:
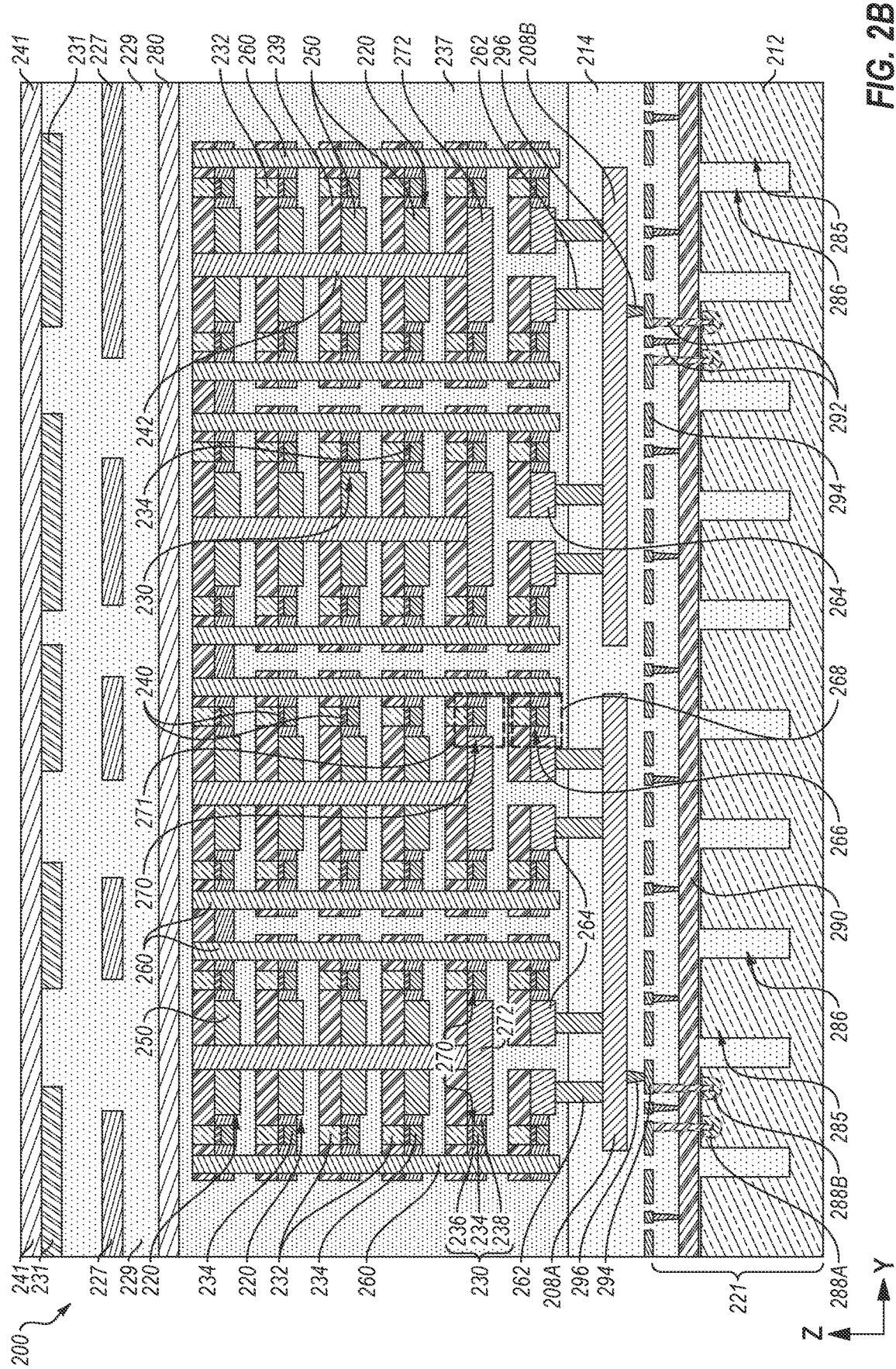

With continued reference to FIG. 1A, each of the first multiplexer controller regions 111 include one or more staircase structures 174 including first conductive contact structures 176 for electrically coupling conductive structures 132 (e.g., word lines) of a stack structure 135 extending horizontally (e.g., in the X-direction) into the respective first multiplexer controller region 111 to one or more components of a second microelectronic device structure (e.g., the second microelectronic device structure 200 (FIG. 2A)). As described in further detail below, the one or more staircase structures 174 and the first conductive contact structures 176 may be vertically over (e.g., in the Z-direction) transistor structures (e.g., transistor structures 185 (FIG. 1C)) of each of the first multiplexer controller regions 111. The first multiplexer controller regions 111 may individually be located within first conductive contact exit regions 119 where the first conductive contact structures 176 exit the staircase structure 174 for electrically connecting to sub word line drivers of the first sub word line driver regions 113.

With collective reference to FIG. 1A and FIG. 1B, global digit lines 108 (also referred to as "conductive lines") horizontally extend (e.g., in the Y-direction) through the first array region 101 and horizontally terminate at horizontally terminal ends (e.g., in the Y-direction) of the first array region 101 within second conductive contact exit regions 106. Each of the global digit lines 108 may individually be in electrical communication with a conductive contact structure 110 (FIG. 1A) at a horizontal end (e.g., in the Y-direction) of the global digit lines 108 within one of the second conductive contact exit regions 106.

The global digit lines 108 include first global digit lines 108A and second global digit lines 108B. The first global digit lines 108A may be referred to herein as "through global digit lines" and the second global digit lines 108B may be referred to herein as "reference global digit lines." The first global digit lines 108A and the second global digit lines 108B may collectively be referred to herein as "global digit lines." In some embodiments, the first global digit lines 108A are located on a first horizontal end (e.g., in the Y-direction) of the first microelectronic device structure 100 and the second global digit lines 108B are located on a second horizontal end (e.g., in the Y-direction) of the first microelectronic device structure 100 opposite the first horizontal end. For example, in the view illustrated in FIG. 1A, the first global digit lines 108A may be located in the upper horizontal half (e.g., in the Y-direction) of the first array region 101 and the second global digit lines 108B may be located in a lower horizontal half (e.g., in the Y-direction) of the first array region 101.

Each of the global digit lines 108 and the conductive contact structures 110 may individually be formed of and include conductive material, such as, for example, one or more of a metal (e.g., tungsten, titanium, nickel, platinum, rhodium, ruthenium, aluminum, copper, molybdenum, iridium, silver, gold), a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide (IrO$_x$), ruthenium oxide (RuO$_x$), alloys thereof, a conductively doped semiconductor material (e.g., conductively doped silicon, conductively doped germanium, conductively doped silicon germanium, etc.), polysilicon, or other materials exhibiting electrical conductivity. In some embodiments, the global digit lines 108 and the conductive contact structures 110 individually comprise tungsten. In other embodiments, the global digit lines 108 and the conductive contact structures 110 individually comprise copper.

With continued reference to FIG. 1A and FIG. 1B, within the first array region 101, the first microelectronic device structure 100 includes vertical (e.g., in the Z-direction) stacks of memory cells 120 over a first base structure 112. Each vertical stack of memory cells 120 comprises a vertical stack of access devices 130 and a vertical stack of storage devices 150, the storage devices 150 of the vertical stack of storage devices 150 coupled to the access devices 130 of the vertical stack of access devices 130. The vertical stacks of memory cells 120 may individually include vertically spaced (e.g., in the Z-direction) levels of memory cells 120, each memory cell 120 individually comprising a storage device 150 horizontally neighboring an access device 130. Although FIG. 1A illustrates seventy two (72) vertical stacks of memory cells 120 (e.g., eight (8) rows and nine (9) columns of vertical stacks of memory cells 120), the disclosure is not so limited, and the array region 101 may include greater than seventy two vertical stacks of memory cells 120.

The first base structure 112 may include a conventional silicon substrate (e.g., a conventional silicon wafer), or another bulk substrate comprising a semiconductive material. As used herein, the term "bulk substrate" means and includes not only silicon substrates, but also silicon-on-insulator (SOI) substrates, such as silicon-on-sapphire (SOS) substrates and silicon-on-glass (SOG) substrates, epitaxial layers of silicon on a base semiconductive foundation, and other substrates formed of and including one or more semiconductive materials (e.g., one or more of a silicon material, such monocrystalline silicon or polycrystalline silicon; silicon-germanium; germanium; gallium arsenide; a gallium nitride; and indium phosphide). In some embodiments, the first base structure 112 comprises a silicon wafer.

In some embodiments, the first base structure 112 includes different layers, structures, devices, and/or regions formed therein and/or thereon. The first base structure 112 includes complementary metal-oxide-semiconductor (CMOS) circuitry and devices configured for effectuating operation of the vertical stacks of memory cells 120 of the first microelectronic device structure 100, such as within each of the first CMOS device and socket regions 117.

With reference to FIG. 1B through FIG. 1D, each of the first sense amplifier device region 105, the first column decoder region 107, the first sense amplifier driver region 109, the first multiplexer controller regions 111, the first sub word line driver regions 113, the first row decoder device regions 115, and the first CMOS device and socket regions 117 may be vertically below (e.g., in the Z-direction) the vertical stacks of memory cells 120. In some embodiments, the global digit lines 108 are vertically between (e.g., in the Z-direction) the vertical stacks of memory cells 120 and each of the first sense amplifier device region 105, the first column decoder region 107, the first sense amplifier driver region 109, the first multiplexer controller regions 111, the first sub word line driver regions 113, the first row decoder device regions 115, and the first CMOS device and socket regions 117.

The first base structure 112 may be electrically isolated from the vertical stacks of memory cells 120 by a first insulative material 114 vertically intervening (e.g., in the Z-direction) between the first base structure 112 and the vertical stacks of memory cells 120. The first insulative material 114 may be formed of and include insulative material such as, for example, one or more of an oxide material (e.g., silicon dioxide ($SiO_2$), phosphosilicate glass, borosilicate glass, borophosphosilicate glass, fluorosilicate glass, titanium dioxide ($TiO_2$), hafnium oxide ($HfO_2$), zirconium dioxide ($ZrO_2$), hafnium dioxide ($HfO_2$), tantalum oxide ($TaO_2$), magnesium oxide (MgO), aluminum oxide ($Al_2O_3$), or a combination thereof), and amorphous carbon. In some embodiments, the first insulative material 114 comprises silicon dioxide.

Each of the first sense amplifier device region 105, the first column decoder region 107, the first sense amplifier driver region 109, the first multiplexer controller regions 111, the first sub word line driver regions 113, and the first row decoder device regions 115 may individually be located within a first control logic device region 121 vertically below (e.g., in the Z-direction) the vertical stack of memory cells 120. The first control logic device region 121 includes each of the first sense amplifier device region 105, the first column decoder region 107, the first sense amplifier driver region 109, the first multiplexer controller regions 111, the first sub word line driver regions 113, and the first row decoder device regions 115. Each of the first sense amplifier device region 105, the first column decoder region 107, the first sense amplifier driver region 109, the first multiplexer controller regions 111, the first sub word line driver regions 113, and the first row decoder device regions 115 individually includes transistor structures 185 formed within the first base structure 112 and vertically below (e.g., in the Z-direction) the vertical stacks of memory cells 120. Horizontally neighboring (e.g., in the X-direction, in the Y-direction) transistor structures 185 are isolated from one another by isolation trenches 186 comprising the first insulative material 114.

The transistor structures 185 may each include conductively doped regions 188, each of which includes a source region 188A and a drain region 188B. Channel regions of the transistor structures 185 may be horizontally interposed between the conductively doped regions 188. In some embodiments, the conductively doped regions 188 of each transistor structure 185 individually comprises one or more semiconductive materials doped with at least one conductivity enhancing chemical species, such as at least one N-type dopant (e.g., one or more of arsenic, phosphorous, antimony, and bismuth) or at least one P-type dopant (e.g., one or more of boron, aluminum, and gallium). In some embodiments, the conductively doped regions 188 comprise conductively doped silicon.

The transistor structures 185 include gate structures 190 vertically overlying the first base structure 112 and horizontally extending between conductively doped regions 188. The conductively doped regions 188 and the gate structures 190 may individually be electrically coupled to first conductive interconnect structures 192. The first conductive interconnect structures 192 may individually electrically couple the conductively doped regions 188 and the gate structures 190 to one or more first routing structures 194.

Figure 2C:
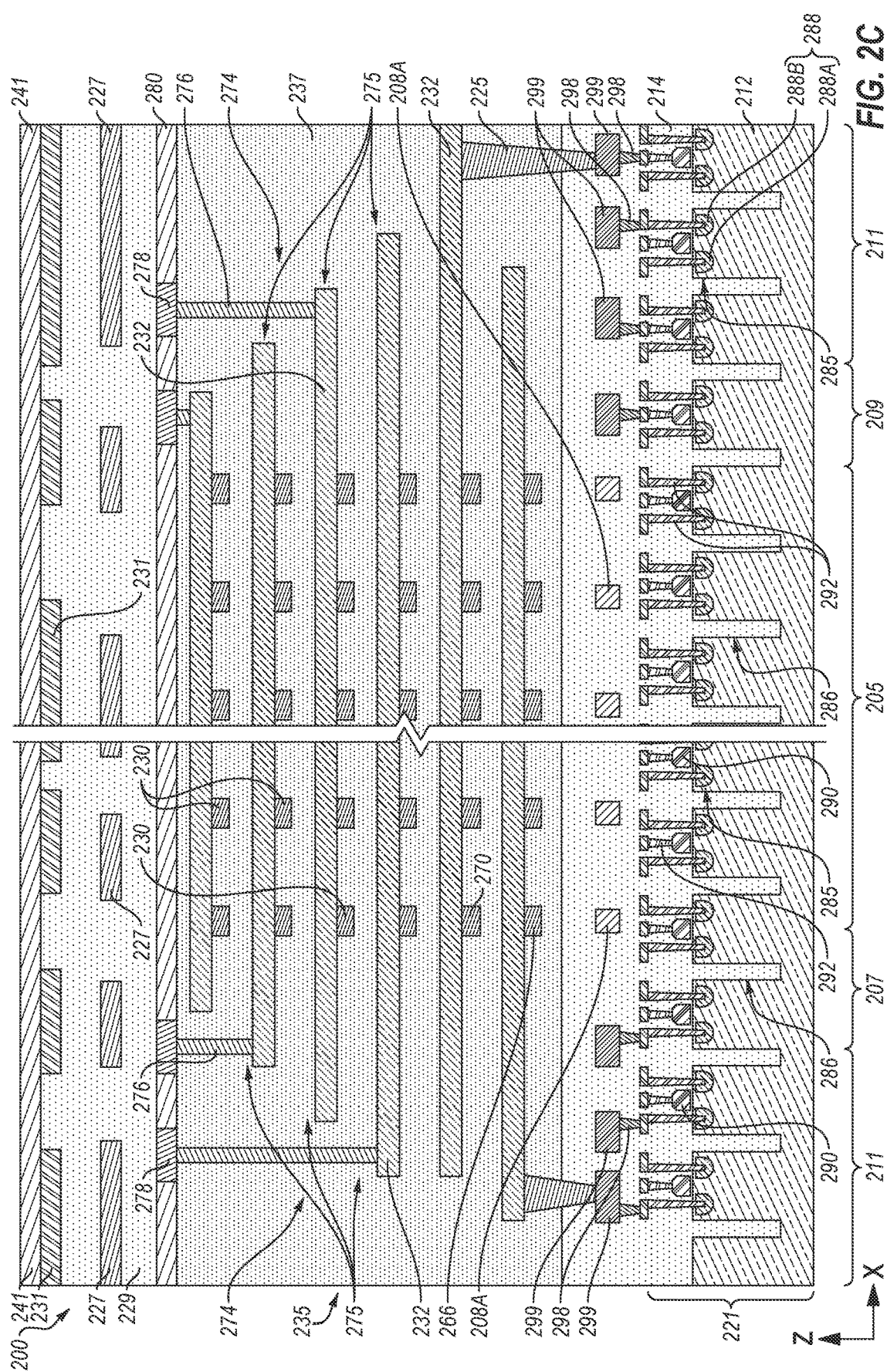
Figure 2D:
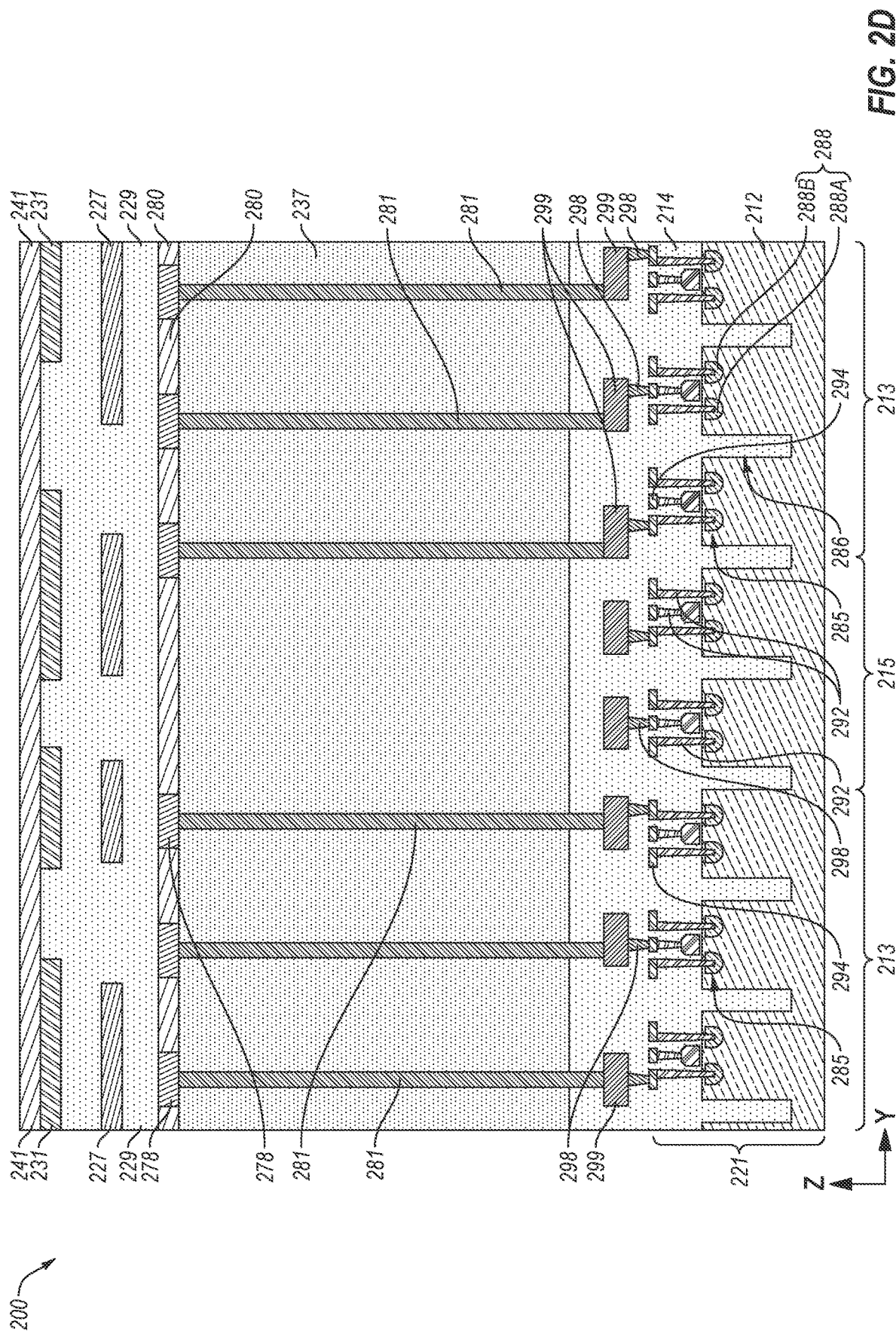

The gate structures 190 may be horizontally aligned (e.g., in the Y-direction) with and shared by the channel regions of multiple transistor structures 185 horizontally neighboring (e.g., in the X-direction (FIG. 1A)) one another. In some such embodiments, the gate structures 190 extend in a first horizontal direction (e.g., in the Y-direction). In addition, dielectric material (also referred to herein as a "gate dielectric material") may be vertically interposed between the gate structures 190 and portions of the first base structure 112 at least partially defining the channel regions of the transistor structures 185. In FIG. 1B, the conductively doped regions 188 and the first conductive interconnect structures 192 in electrical communication with the conductively doped regions 188 are not illustrated, but it will be understood, that the conductively doped regions 188 and the first conductive interconnect structures 192 are located in a plane different than that in which the gate structures 190 extend. By way of non-limiting example, each gate structure 190 may be in electrical communication with a plurality of source regions 188A on a first side of the gate structure 190 (e.g., spaced from the gate structure 190 in the X-direction) and a plurality of drain regions 188B on a second, opposite side of the gate structure 190 (e.g., spaced from the gate structure 190 in the X-direction opposite the source regions 188A). At least some of the first routing structures 194 (e.g., the first routing structures 194) not in electrical communication with the first conductive interconnect structures 192 in electrical communication with the gate structure 190 may be in electrical communication with conductive interconnect structures 192 that are, in turn, in electrical communication with one of the source regions 188A or one of the drain regions 188B, as illustrated in FIG. 2C and FIG. 2D. With continued reference to FIG. 1B, two of each of the source regions 188A and the drain regions 188B, and four of the first conductive interconnect structures 192 are illustrated in broken lines to indicate that such source regions 188A, drain regions 188B, and first conductive interconnect structures 192 are located in a plane different than the plane in which the gate structure 190 illustrated in FIG. 1B extends.

Each of the gate structures 190, the first conductive interconnect structure 192, and the first routing structures 194 may individually be formed of and include conductive material, such as one or more of the materials described above with reference to the global digit lines 108. In some embodiments, the gate structures 190, the first conductive interconnect structure 192, and the first routing structures 194 are individually formed of and include tungsten. In other embodiments, the gate structures 190, the first conductive interconnect structure 192, and the first routing structures 194 are individually formed of and include copper.

The first insulative material 114 may be between the transistor structures 185 and electrical isolate different portions of the transistor structures 185, the first conductive interconnect structures 192, and the first routing structures 194.

With continued reference to FIG. 1B, the transistor structures 185 within the first sense amplifier device region 105 may be included within and partially form (e.g., in conjunction with local routing structures) sense amplifier devices. In some embodiments, at least some of the transistors structures 185 of the first sense amplifier device region 105 are in electrical communication with the global digit lines 108 by means of the first routing structures 194 and second conductive interconnect structures 196. In some embodiments, each sense amplifier device of the first sense amplifier device region 105 includes a plurality of the transistor structures 185 and is in electrical communication with one of the first global digit lines 108A (e.g., through one of the transistor structures 185) and one of the second global digit lines 108B (e.g., through an additional one of the transistor structures 185). In use and operation (e.g., such as during a read operation), the sense amplifier devices of the first sense amplifier device region 105 are configured to amplify a signal (e.g., a difference in voltage) between the first global digit line 108A and the second global digit line 108B to which the sense amplifier device is connected.

With reference to FIG. 1C and FIG. 1D, the transistor structures 185 in each of the first column decoder region 107, the first sense amplifier driver region 109, the first multiplexer controller region 111, the first sub word line driver regions 113, and the first row decoder device regions 115 may individually be in electrical communication with third conductive interconnect structures 198 that are, in turn, in electrical communication with second routing structures 199. The second routing structures 199 may be configured to electrically connect respective transistor structures 185 within a first region of the first microelectronic device structure 100 to another region of, for example, the first microelectronic device structure 100. By way of non-limiting example, at least some of the second routing structures 199 in electrical communication with transistor structures 185 within the first column decoder region 107 may be in electrical communication with transistor structures 185 of the first sense amplifier device region 105 and/or transistor structures 185 one or more of the first multiplexer controller region 111; the second routing structures 199 in electrical communication with transistor structures 185 within the first sense amplifier driver region 109 may be in electrical communication with transistor structures 185 within the first sense amplifier device region 105; the second routing structures 199 in electrical communication with transistor structures 185 within the first multiplexer controller regions 111 may be in electrical communication with multiplexers (e.g., multiplexers 166 (FIG. 1B)) and/or with transistor structures 185 within the first column decoder region 107; at least some of the second routing structures 199 in electrical communication with transistor structures 185 within the first sub word line driver regions 113 may be in electrical communication with conductive interconnect structures (e.g., first conductive contact structures 176 (FIG. 1C), such as by means of third routing structures 178) in electrical communication with the conductive structures 132 of the stack structures 135, and at least some of the second routing structures 199 in electrical communication with transistor structures 185 within the first sub word line driver regions 113 may be in electrical communication with at least some of the transistor structures 185 within the first row decoder device regions 115; and the second routing structures 199 in electrical communication with transistor structures 185 within the first row decoder device regions 115 may be in electrical communication with transistor structures 185 within the first sub word line driver regions 113.

Each of the second conductive interconnect structures 196, the third conductive interconnect structures 198, and the second routing structures 199 may individually be formed of and include conductive material, such as one or more of the materials described above with reference to the first conductive interconnect structures 192. In some embodiments, each of the second conductive interconnect structures 196, the third conductive interconnect structures 198, and the second routing structures 199 are individually formed of and include tungsten. In other embodiments, each of the second conductive interconnect structures 196, the third conductive interconnect structures 198, and the second routing structures 199 are individually formed of and include copper.

With reference to FIG. 1B, each vertical stack of memory cells 120 comprises a vertical stack of access devices 130 and a vertical stack of storage devices 150 horizontally neighboring (e.g., in the X-direction) the vertical stack of access devices 130. Each of the access devices 130 may individually be operably coupled to a conductive structure 132 (FIG. 1A through FIG. 1C) of a stack structure 135 (FIG. 1A, FIG. 1C) comprising levels of the conductive structures 132 (also referred to herein as "first conductive lines," "access lines," or "word lines") vertically (e.g., in the Z-direction) spaced from one another by one or more insulative structures 137.

The access devices 130 may each individually comprise a channel material 134 between a source material 136 and a drain material 138. The channel material 134 may be horizontally (e.g., in the X-direction) between the source material 136 and the drain material 138. The source material 136 and the drain material 138 may each individually comprise a semiconductive material (e.g., polysilicon) doped with at least one N-type dopant, such as one or more of arsenic ions, phosphorous ions, and antimony ions. In other embodiments, the source material 136 and the drain material 138 each individually comprise a semiconductive material doped with at least one P-type dopant, such as boron ions.

In some embodiments, the channel material 134 comprises a semiconductive material (e.g., polysilicon) doped with at least one N-type dopant or at least one P-type dopant. In some embodiments, the channel material 134 is doped with one of at least one N-type dopant and at least one P-type dopant and each of the source material 136 and the drain material 138 are each individually doped with the other of the at least one N-type dopant and the at least one P-type dopant.

The conductive structures (word lines) 132 may extend horizontally (e.g., in the X-direction; FIG. 1C) through the vertical stacks of memory cells 120 as lines and may each be configured to be operably coupled to a vertically (e.g., in the Z-direction) neighboring channel material 134 of the vertically neighboring (e.g., in the Z-direction) access devices 130. In other words, a conductive structure 132 may be configured to be operably coupled to a vertically neighboring access device 130.

The conductive structures 132 may be configured to provide sufficient voltage to a channel region (e.g., channel material 134) of each of the access devices 130 to electrically couple a storage device 150 horizontally neighboring (e.g., in the Y-direction) and associated with the access device 130 to, for example, a conductive pillar structure (e.g., conductive pillar structure 160) vertically extending (e.g., in the Z-direction) through the vertical stack of access devices 130 of the vertical stack of memory cells 120. The stack structure 135 including the vertically spaced conductive structures 132 may intersect the vertical stacks of memory cells 120, such as the vertical stacks of the access devices 130 of the vertical stacks of memory cells 120, each of the conductive structures 132 of the stack structure 135 intersecting a level (e.g., a tier) of the memory cells 120 of the vertical stack of memory cells 120. With reference to FIG. 1A, each stack structure 135 individually extends through several vertical stacks of access devices 130 of the vertical stacks of memory cells 120. In some embodiments, each stack structure 135 extends through horizontally neighboring (e.g., in the X-direction) vertical stacks of memory cells 120. In some embodiments, the stack structures 135 extending in a first horizontal direction (e.g., in the X-direction) are spaced from each other in a second horizontal direction (e.g., in the Y-direction).

Although FIG. 1A and FIG. 1B illustrate that conductive structures 132 of the stack structure 135 individually intersect and form portions of nine (9) of the vertical stacks of memory cells 120, the disclosure is not so limited. In other embodiments, conductive structures 132 of the stack structure 135 individually intersect and form portions of fewer than nine (9) of the vertical stacks of memory cells 120, such as fewer than or equal to eight (8) of the vertical stacks of the memory cells 120, fewer than or equal to six (6) of the vertical stacks of the memory cells 120, or fewer than or equal to four (4) of the vertical stacks of the memory cells 120. In other embodiments, the conductive structures 132 of the stack structure 135 individually intersect and form portions of more than nine (9) of the vertical stacks of the memory cells 120, such as more than or equal to ten (10) of the vertical stacks of the memory cells 120, more than or equal to twelve (12) of the vertical stacks of the memory cells 120, more than or equal to sixteen (16) of the vertical stacks of the memory cells 120, or more than or equal to twenty (20) of the vertical stacks of the memory cells 120.

The conductive structures 132 may individually be formed of and include conductive material, such as one or more of the materials described above with reference to the global digit lines 108. In some embodiments, the conductive structures 132 are individually formed of and include tungsten. In other embodiments, the conductive structures 132 are individually formed of and include copper.

The channel material 134 may be separated from the conductive structures 132 by a dielectric material 140, which may also be referred to herein as a "gate dielectric material." The dielectric material 140 may be formed of and include insulative material. By way of non-limiting example, the dielectric material 140 may comprise one or more of phosphosilicate glass, borosilicate glass, borophosphosilicate glass (BPSG), fluorosilicate glass, silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride, another gate dielectric material, a dielectric carbon nitride material (e.g., silicon carbon nitride (SiCN))), or a dielectric carboxynitride material (e.g., silicon carboxynitride (SiOCN)). In other embodiments, the channel material 134 directly contacts a vertically neighboring conductive structure 132.

In some embodiments, insulative structures 137 and additional insulative structures 139 vertically (e.g., in the Z-direction) intervene between vertically neighboring access devices 130 and vertically neighboring storage devices 150. The additional insulative structures 139 may horizontally (e.g., in the Y-direction) neighbor each of the conductive structures 132. With reference to FIG. 1C, the levels of the conductive structures 132 vertically alternate with the levels of the insulative structures 137. For clarity and ease of understanding the description, in FIG. 1C, the levels of the insulative structures 137 are illustrated as comprising an integral structure. In other embodiments, the levels of the insulative structures 137 may exhibit distinct boundaries at interfaces of the levels of the conductive structures 132.

The insulative structures 137 may individually be formed of and include insulative material. In some embodiments, the insulative structures 137 may each individually be formed of and include, for example, an insulative material, such as one or more of an oxide material (e.g., silicon dioxide ($SiO_2$), phosphosilicate glass, borosilicate glass, borophosphosilicate glass, fluorosilicate glass, titanium dioxide ($TiO_2$), hafnium oxide ($HfO_2$), zirconium dioxide ($ZrO_2$), hafnium dioxide ($HfO_2$), tantalum oxide ($TaO_2$), magnesium oxide (MgO), aluminum oxide ($Al_2O_3$), or a combination thereof), and amorphous carbon. In some embodiments, the insulative structures 137 comprise silicon dioxide. Each of the insulative structures 137 may individually include a substantially homogeneous distribution of the at least one insulating material, or a substantially heterogeneous distribution of the at least one insulating material. As used herein, the term "homogeneous distribution" means amounts of a material do not vary throughout different portions (e.g., different horizontal portions, different vertical portions) of a structure. Conversely, as used herein, the term "heterogeneous distribution" means amounts of a material vary throughout different portions of a structure. Amounts of the material may vary stepwise (e.g., change abruptly), or may vary continuously (e.g., change progressively, such as linearly, parabolically) throughout different portions of the structure. In some embodiments, each of the insulative structures 137 exhibits a substantially homogeneous distribution of insulative material. In additional embodiments, at least one of the insulative structures 137 exhibits a substantially heterogeneous distribution of at least one insulative material. The insulative structures 137 may, for example, be formed of and include a stack (e.g., laminate) of at least two different insulative materials. The insulative structures 137 may each be substantially planar, and may each individually exhibit a desired thickness.

The additional insulative structures 139 may be formed of and include an insulative material that is different than, and that has an etch selectivity with respect to, the insulative structures 137. In some embodiments, the additional insulative structures 139 are formed of and include a nitride material (e.g., silicon nitride ($Si_3N_4$)) or an oxynitride material (e.g., silicon oxynitride). In some embodiments, the additional insulative structures 139 comprise silicon nitride. In other embodiments, the additional insulative structures 139 comprise substantially the same material composition as the insulative structures 137. In some embodiments, the additional insulative structures 139 comprise silicon dioxide.

In some embodiments, the storage devices 150 are in electrical communication with a conductive structure 142 (not illustrated in FIG. 1A for clarity and ease of understanding the description). The conductive structure 142 may be formed of and include conductive material, such as one or more of the materials of an electrode (e.g., a second electrode 154) of the storage devices 150. In some embodiments, the conductive structure 142 comprises substantially the same material composition as an electrode of the storage devices 150. In other embodiments, the conductive structure 142 comprises a different material composition than the electrodes of the storage devices 150. The conductive structures 142 may be referred to herein as "conductive plates" or "ground structures."

With continued reference to FIG. 1B, one of the storage devices 150 along with neighboring structures are illustrated in enlarged box 155. In some embodiments, each of the storage devices 150 individually comprises a first electrode 152 (also referred to herein as an "outer electrode," "a first electrode plate," or a "first node structure"), a second electrode 154 (also referred to herein as an "inner electrode," "a second electrode plate," or a "second node structure"), and a dielectric material 156 between the first electrode 152 and the second electrode 154. In some such embodiments, the storage devices 150 individually comprise capacitors. However, the disclosure is not so limited and in other embodiments, the storage devices 150 may each individually comprise other structures, such as, for example, phase change memory (PCM), resistance random-access memory (RRAM), conductive-bridging random-access memory (conductive bridging RAM), or another structure for storing a logic state.

The first electrode 152 may be formed of and include conductive material such as, for example, one or more of a metal (e.g., tungsten, titanium, nickel, platinum, rhodium, ruthenium, aluminum, copper, molybdenum, iridium, silver, gold), a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively doped semiconductor material (e.g., conductively doped silicon, conductively doped germanium, conductively doped silicon germanium), polysilicon, and other materials exhibiting electrical conductivity. In some embodiments, the first electrode 152 comprises titanium nitride.

The second electrode 154 may be formed of and include conductive material. In some embodiments, the second electrode 154 comprises one or more of the materials described above with reference to the first electrode 152. In some embodiments, the second electrode 154 comprises substantially the same material composition as the first electrode 152.

The dielectric material 156 may be formed of and include one or more of silicon dioxide ($SiO_2$), silicon nitride ($Si_3N_4$), polyimide, titanium dioxide ($TiO_2$), tantalum oxide ($Ta_2O_5$), aluminum oxide ($Al_2O_3$), an oxide-nitride-oxide material (e.g., silicon dioxide-silicon nitride-silicon dioxide), strontium titanate ($SrTiO_3$) (STO), barium titanate ($BaTiO_3$), hafnium oxide ($HfO_2$), zirconium oxide ($ZrO_2$), a ferroelectric material (e.g., ferroelectric hafnium oxide, ferroelectric zirconium oxide, lead zirconate titanate (PZT)), and a high-k dielectric material.

The second electrode 154 may be in electrical communication with one of the conductive structures 142 of a vertical stack of memory cells 120. In some embodiments, the conductive structures 142 are individually formed of conductive material, such as one or more of the materials of the second electrode 154. In some embodiments, the conductive structures 142 comprise substantially the same material composition as the second electrode 154. In other embodiments, the conductive structures 142 comprise a different material composition than the second electrode 154.

With continued reference to FIG. 1A and FIG. 1B, the first microelectronic device structure 100 may include conductive pillar structures 160 vertically extending (e.g., in the Z-direction) through the first microelectronic device structure 100. The conductive pillar structures 160 may also be referred to herein as "digit lines," "second conductive lines," "digit line pillar structures," "local digit lines," or "vertical digit lines." The conductive pillar structures 160 may be electrically coupled to the access devices 130 to facilitate operation of the memory cells 120 of a vertical stack of memory cells 120. Stated another way, each conductive pillar structure 160 vertically extends through access devices 130 of a vertical stack of memory cells 120.

In some, the conductive pillar structures 160 in horizontally neighboring (e.g., in the Y-direction) stack structures 135 are horizontally aligned (e.g., in the X-direction) with each other. In other embodiments, conductive pillar structures 160 in horizontally neighboring (e.g., in the Y-direction) stack structures 135 are horizontally aligned (e.g., in the X-direction) with each other.

The conductive pillar structures 160 may individually be formed of and include conductive material, such as one or more of a metal (e.g., one or more of tungsten, titanium, nickel, platinum, rhodium, ruthenium, aluminum, copper, molybdenum, iridium, silver, gold), a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively doped semiconductor material (e.g., conductively doped silicon, conductively doped germanium, conductively doped silicon germanium, etc.), polysilicon, or other materials exhibiting electrical conductivity. In some embodiments, the conductive pillar structures 160 comprise tungsten.

With reference still to FIG. 1B, in some embodiments, each global digit line 108 (FIG. 1A, FIG. 1B) may be in electrical communication with one or more global digit line contact structures 162 that are, in turn, individually in electrical communication with a conductive structure 164 to selectively couple the respective global digit line 108 to one of the conductive pillar structures 160 through a multiplexer 166, illustrated in box 168. In some embodiments, the multiplexers 166 may facilitate selective provision of a voltage from a conductive pillar structure 160 to which it is electrically connected (by means of the global digit line contact structure 162) to selectively provide the voltage of the conductive pillar structure 160 to the global digit line 108 through the multiplexer 166. In other words, the global digit lines 108 are configured to be selectively electrically connected to the conductive pillar structures 160 by means of the multiplexers 166. Accordingly, the global digit lines 108 are configured to be selectively electrically connected to conductive pillar structures 160 vertically extending (e.g., in the Z-direction) through a respective vertical stack of memory cells 120 by applying a voltage to the multiplexer 166 electrically connecting the global digit line 108 to the particular conductive pillar structure 160 by means of the global digit line contact structure 162 and the conductive structures 164 between the global digit line 108 and the multiplexer 166 associated with the particular conductive pillar structure 160. The multiplexers 166 may be driven by a multiplexer driver and/or a multiplexer control logic device operably coupled to the conductive structure 132 to which the multiplexer 166 is coupled (e.g., the conductive structure 132 vertically above (e.g., in the Z-direction) the multiplexer 166). For example, and as described in further detail herein, the multiplexers 166 may be coupled to one or more structures (e.g., transistor structures 185) within the first multiplexer controller region 111 to selectively drive the multiplexers 166.

Each global digit line 108 may be configured to be selectively coupled to more than one of the conductive pillar structures 160 by means of the multiplexers 166 coupled to each of the conductive pillar structures 160. In some embodiments, each global digit line 108 is configured to selectively be in electrical communication with four (4) of the conductive pillar structures 160, each one of which is associated with a different stack structure 135. In other embodiments, each of the global digit lines 108 is configured to selectively be in electrical communication with eight (8) of the conductive pillar structures 160 or sixteen (16) of the conductive pillar structures 160. One of the multiplexers 166 may be located between (e.g., horizontally between) a conductive pillar structure 160 and a horizontally neighboring conductive structure 164 that is, in turn, in electrical communication with a global digit line 108 by means of a global digit line contact structure 162. Accordingly, in some embodiments, the multiplexers 166 are individually configured to receive a signal (e.g., a select signal) from a multiplexer controller region (e.g., one of the first multiplexer controller regions 111) and provide the signal to a bit line (e.g., conductive pillar structures 160 (FIG. 1B)) to selectively access desired memory cells within the first array region 101 for effectuating one or more control operations of the memory cells 120.

In some embodiments, the global digit line contact structures 162 and the conductive structures 164 individually comprise a conductive material, such as a material exhibiting a relatively low resistance value to facilitate an increased speed (e.g., low RC delay) of data transmission. In some embodiments, the global digit line contact structures 162 and the conductive structures 164 individually comprise copper. In other embodiments, the global digit line contact structures 162 and the conductive structures 164 individually comprise tungsten. In yet other embodiments, the global digit line contact structures 162 and the conductive structures 164 individually comprise titanium nitride.

The global digit lines 108 and at least a portion of each of the global digit line contact structures 162 may be formed within the first insulative material 114.

In some embodiments, an access device 130 vertically (e.g., in the Z-direction) neighboring (e.g., vertically above) the multiplexer 166 may comprise a transistor 170, one of which is illustrated in box 171, configured to electrically couple a horizontally neighboring (e.g., in the X-direction) conductive pillar structure 160 to the conductive structure 142 through an additional conductive structure 172. The transistor 170 may comprise a so-called "bleeder" transistor or a "leaker" transistor configured to provide a bias voltage to the conductive pillar structures 160 to which it is coupled (e.g., the horizontally neighboring (e.g., in the X-direction) conductive pillar structures 160). In some embodiments, the conductive structure 132 coupled to the transistors 170 may be in electrical communication with a voltage, such as a drain voltage $V_{dd}$ or a voltage source supply $V_{ss}$. In use and operation, the transistors 170 are configured to provide a negative voltage to the conductive pillar structures 160 of unselected (e.g., inactive) vertical stacks of memory cells 120. In other words, the transistors 170 are configured to electrically connect unselected conductive pillar structures 160 with their respective conductive structures 142 (e.g., ground structures, cell plates), which may be coupled to a negative voltage. In some embodiments, each vertical stack of memory cells 120 includes at least one (e.g., one) of the multiplexers 166 and at least one (e.g., one) of the transistors 170.

The additional conductive structure 172 may comprise one or more of the conductive materials described above with reference to the conductive structures 164. In some embodiments, the additional conductive structure 172 comprises substantially the same material composition as the conductive structure 164. In some embodiments, the additional conductive structure 172 comprises copper. In other embodiments, the additional conductive structure 172 comprises tungsten. In yet other embodiments, the additional conductive structure 172 comprises titanium nitride.

With reference to FIG. 1A and FIG. 1C, the conductive structures 132 of the stack structure 135 may horizontally (e.g., in the X-direction) terminate at staircase structures 174 located at horizontally (e.g., in the X-direction) terminal portions of the stack structure 135. While the staircase structures 174 are illustrated in FIG. 1A, it will be understood that the staircase structures 174 are located beneath a vertically upper (e.g., in the Z-direction) surface of the first microelectronic device structure 100. With reference to FIG. 1C, vertically higher (e.g., in the Z-direction) conductive structures 132 may have a smaller horizontal dimension (e.g., in the X-direction) than vertically lower conductive structures 132, such that horizontal edges of the conductive structures 132 at least partially define steps 175 of the staircase structures 174. In some embodiments, the memory cells 120 of the vertical stack of memory cells 120 that are vertically higher (e.g., in the Z-direction) than other memory cells 120 comprise and are intersected by conductive structures 132 having a smaller horizontal dimension (e.g., in the X-direction) than conductive structures 132 of vertically lower memory cells 120 of the vertical stacks of memory cells 120. In some embodiments, a horizontal dimension (e.g., in the X-direction) of the conductive structures 132 of the multiplexers 166 may be the same as or greater than a horizontal dimension (e.g., in the X-direction) of the conductive structures 132 of the transistors 170, which may be greater than a horizontal dimension (e.g., in the X-direction) of the conductive structures 132 intersecting the memory cells 120.

In some embodiments, the global digit lines 108 are located vertically below (e.g., in the Z-direction) the stack structures 135, the staircase structures 174, and the vertical stacks of memory cells 120. In some embodiments, the vertical stacks of memory cells 120, the stack structures 135, and the staircase structures 174 are vertically spaced from the first base structure 112 a greater vertical distance than the global digit lines 108. In some embodiments, the global digit lines 108 are located vertically closer (e.g., in the Z-direction) to conductive structures 132 having a greater horizontal dimension (e.g., in the X-direction) than conductive structures 132 having a relatively shorter horizontal dimension (e.g., in the X-direction).

The staircase structures 174 may individually be located within one of the first multiplexer controller regions 111. Stated another way, each of the first multiplexer controller regions 111 may include at least a portion of (e.g., all of) one or more of the staircase structures 174. With reference to FIG. 1A, in some embodiments, the staircase structures 174 of each of the stack structures 135 are horizontally aligned in a first direction (e.g., in the X-direction) and horizontally offset in a second direction (e.g., the Y-direction). In some such embodiments, each stack structure 135 individually includes a staircase structure 174 at a first horizontal end (e.g., in the X-direction) of the stack structure 135 and an additional staircase structure 174 at a second, opposite horizontal end (e.g., in the X-direction) of the stack structure 135. In some embodiments, each stack structure 135 may individually include a staircase structure 174 within each of the first multiplexer controller regions 111.

In other embodiments, the staircase structures 174 of horizontally neighboring (e.g., in the Y-direction) stack structures 135 may be located at opposing horizontal ends (e.g., in the X-direction) of the first microelectronic device structure 100. In some such embodiments, every other stack structure 135 (e.g., in the Y-direction) includes a staircase structure 174 at a first horizontal end (e.g., in the X-direction) of the first microelectronic device structure 100 while the other of the stack structures 135 individually includes a staircase structure 174 at a second horizontal end (e.g., in the X-direction) of the first microelectronic device structure 100 opposite the first horizontal end. Stated another way, the staircase structures 174 of horizontally neighboring (e.g., in the Y-direction) stack structures 135 may alternate between a first horizontal end (e.g., in the X-direction) of the first microelectronic device structure 100 and a second horizontal end (e.g., in the X-direction) of the first microelectronic device structure 100, the second horizontal end opposing the first horizontal end.

Although FIG. 1A illustrates two staircase structures 174 for every stack structure 135 (e.g., a staircase structure 174 at each horizontal end (e.g., in the X-direction) of each stack structure 135), the disclosure is not so limited. In other embodiments, each stack structure 135 may include one staircase structure 174, and each of the staircase structures 174 may be located at a same horizontal end (e.g., in the X-direction) of the stack structures 135. In some such embodiments, the staircase structures 174 may be located one of the first multiplexer controller regions 111.

The quantity of the steps 175 of the staircase structures 174 may correspond to the quantity of the levels of memory cells 120 of the vertical stack (minus one level for the multiplexers 166 and one level for the transistors 170). Although FIG. 1A and FIG. 1C illustrate that the staircase structures 174 individually comprise a particular number (e.g., six (6)) steps 175, the disclosure is not so limited. In other embodiments, the staircase structures 174 each individually include a desired quantity of the steps 175, such as within a range from thirty-two (32) of the steps 175 to two hundred fifty-six (256) of the steps 175. In some embodiments, the staircase structures 174 each individually include sixty-four (64) of the steps 175. In other embodiments, the staircase structures 174 each individually include ninety-six (96) or more of the steps 175. In other embodiments, the staircase structures 174 each individually include a different number of the steps 175, such as less than sixty-four (64) of the steps 175 (e.g., less than or equal to sixty (60) of the steps 175, less than or equal to fifty (50) of the steps 175, less than about forty (40) of the steps 175, less than or equal to thirty (30) of the steps 175, less than or equal to twenty (20) of the steps 175, less than or equal to ten (10) of the steps 175); or greater than sixty-four (64) of the steps 175 (e.g., greater than or equal to seventy (70) of the steps 175, greater than or equal to one hundred (100) of the steps 175, greater than or equal to about one hundred twenty-eight (128) of the steps 175, greater than two hundred fifty-six (256) of the steps 175). In some embodiments, the number of memory cells 120 in a vertical stack of memory cells 120 is within a range from four (4) to about one hundred (100) memory cells 120.

In some embodiments, the staircase structures 174 each individually include the same quantity of the steps 175. In some such embodiments, staircase structures 174 of the same stack structure 135 include the same quantity of the steps 175. In some embodiments, each step 175 of each staircase structure 174 of a stack structure 135 are vertically offset (e.g., in the Z-direction) from a vertically neighboring step 175 of the staircase structure 174 by one level (e.g., one tier) of the vertically alternating conductive structures 132 and insulative structures 137. In some such embodiments, every conductive structure 132 of the stack structure 135 may comprise a step 175 at each horizontal end (e.g., in the X-direction) of the staircase structures 174 of the stack structure 135. In other embodiments, vertically neighboring (e.g., in the Z-direction) steps 175 of a staircase structure 174 on a first horizontal size (e.g., in the X-direction) of a stack structure 135 are vertically offset (e.g., in the Z-direction) by two levels (e.g., two tiers) of the vertically alternating conductive structures 132 and insulative structures 137. In some such embodiments, the steps 175 of each staircase structure 174 are formed of every other conductive structure 132 of the stack structure 135 and the steps 175 of staircase structures 174 at horizontally opposing ends (e.g., in the X-direction) of the same stack structure 135 may be defined by stack structures 135 that are vertically spaced (e.g., in the Z-direction) from one another by one level of a conductive structure 132 and an insulative structure 137.

With continued reference to FIG. 1A and FIG. 1C, first conductive contact structures 176 may be in electrical communication with individual conductive structures 132 at the steps 175. For example, the first conductive contact structures 176 may individually physically contact (e.g., land on) portions of upper surfaces of the conductive structures 132 at least partially defining treads of the steps 175. In some embodiments, every other step 175 of each staircase structure 174 may be in electrical communication with a first conductive contact structure 176. In some such embodiments, each stack structure 135 includes one staircase structure 174 at each horizontal (e.g., in the X-direction) end thereof and every other step 175 of each staircase structure 174 is individually in contact with a first conductive contact structure 176. Each conductive structure 132 of a first staircase structure 174 at a first horizontal end of the stack structure 135 not in electrical communication with a first conductive contact structure 176 may individually be in electrical communication with a first conductive contact structure 176 at steps 175 of a second staircase structure 174 at a second, opposite horizontal end of the stack structure 135. In other embodiments, each step 175 of each staircase structure 174 may be in electrical communication with a first conductive contact structure 176 at the horizontal (e.g., in the X-direction) end of the staircase structure 174.

The first conductive contact structures 176 may individually be formed of and include conductive material, such as one or more of the materials described above with reference to the conductive pillar structures 160. In some embodiments, the first conductive contact structures 176 comprise substantially the same material composition as the conductive pillar structures 160. In other embodiments, the first conductive contact structures 176 comprise a different material composition than the conductive pillar structures 160. In some embodiments, the first conductive contact structures 176 comprise tungsten.

Third routing structures 178 may vertically overlie and individually be in electrical communication with of the first conductive contact structures 176. Each of the first conductive contact structures 176 is individually in electrical communication with one of the third routing structures 178. The third routing structures 178 may be formed within a second insulative material 180.

The third routing structures 178 may individually be formed of and include conductive material, such as one or more of the materials described above with reference to the global digit lines 108. In some embodiments, the third routing structures 178 are formed of and include tungsten. In other embodiments, the third routing structures 178 are formed of and include copper.

With continued reference to FIG. 1C, in some embodiments, the conductive structures 132 in electrical communication with the multiplexers 166 may be in electrical communication with transistor structures 185 within the first multiplexer controller region 111 by means of fourth conductive interconnect structures 125. In addition, the conductive structures 132 in electrical communication with the transistors 170 may be in electrical communication with transistor structures 185 within the first multiplexer controller region 111 by means of other fourth conductive interconnect structures 125. In some embodiments, the conductive structure 132 in electrical communication with the multiplexers 166 is in electrical communication with transistor structures 185 of a first one of the first multiplexer controller regions 111 and the conductive structure 132 in electrical communication with the transistors 170 is in electrical communication with transistor structures 185 of the other of the first multiplexer controller regions 111. In some embodiments, a vertically lowermost conductive structure 132 (e.g., the conductive structure 132 in electrical communication with the multiplexers 166) extends farther in a first horizontal direction (e.g., in the X-direction) than the next vertically lowermost conductive structure 132 (e.g., the conductive structure 132 in electrical communication with the transistors 170); and the next vertically lowermost conductive structure 132 extends farther in a second horizontal direction (e.g., in the X-direction) opposite the first horizontal direction than the vertically lowermost conductive structure 132 to facilitate electrically connecting the vertically lowermost conductive structure 132 and the next vertically lowermost conductive structure 132 with the transistor structures 185 by means of the fourth conductive interconnect structures 125 without electrically shorting to one another.

FIG. 1D is a simplified partial cross-sectional view of the first microelectronic device structure 100 taken through section line D-D of FIG. 1A, and illustrate a partial cross-sectional view of some of the first sub word line driver regions 113 and the first row decoder device regions 115.

In some embodiments, the third routing structures 178 in electrical communication with the conductive structures 132 (FIG. 1C) by means of the first conductive contact structures 176 (FIG. 1C) are routed to a location vertically above (e.g., in the Z-direction) and within horizontal boundaries (e.g., in the X-direction, in the Y-direction) transistor structures 185 of the first sub word line driver regions 113. The third routing structures 178 are, in turn, in electrical communication with the transistor structures 185 of the first sub word line driver regions 113 by means of fifth conductive interconnect structures 181 and the second routing structures 199 and the third conductive interconnect structures 198 in electrical communication with the transistor structures 185 of the first sub word line driver regions 113.

In some embodiments, at least some of the transistor structures 185 of the first row decoder device regions 115 are in electrical communication with transistor structures 185 of the first sub word line driver regions 113, such as in a different cross-section than that illustrated in FIG. 1D. By way of non-limiting example, in some embodiments, the second routing structures 199 in electrical communication with the transistor structures 185 of the first row decoder device regions 115 are in electrical communication with second routing structures 199 that are in electrical communication with transistor structures 185 of the first sub word line driver regions 113.

With reference to FIG. 1E and FIG. 1F, one or more sixth conductive interconnect structures 182 vertically extend (e.g., in the Z-direction) through the insulative structures 137 and the first insulative material 114 to contact the first base structure 112 within the first device and socket regions 117.

A first pad structure 184 may vertically overlie and individually be in electrical communication with one of the sixth conductive interconnect structures 182. The first pad structures 184 may be located within the second insulative material 180.

The fifth conductive interconnect structures 181 and the sixth conductive interconnect structures 182 may individually be formed of and include conductive material, such as one or more of the materials described above with reference to the first conductive interconnect structures 192. In some embodiments, each of the fifth conductive interconnect structures 181 and the sixth conductive interconnect structures 182 are formed of and include tungsten. In other embodiments, each of the fifth conductive interconnect structures 181 and the sixth conductive interconnect structures 182 are formed of and include copper.

The first pad structures 184 may individually be formed of and include conductive material, such as one or more of the materials described above with reference to the global digit lines 108. In some embodiments, the first pad structures 184 are formed of and include tungsten. In other embodiments, the first pad structures 184 are formed of and include copper.

With collective reference to FIG. 1B through FIG. 1F, the second insulative material 180 vertically overlies the first microelectronic device structure 100. As described in further detail herein, the second insulative material 180 may facilitate attaching (e.g., bonding) the first microelectronic device structure 100 to a second microelectronic device structure (e.g., the second microelectronic device structure 200 (FIG. 2A)).

The second insulative material 180 may be formed of and include one or more of the materials described above with reference to the first insulative material 114. In some embodiments, the second insulative material 180 comprises substantially the same material composition as the first insulative material 114. In some embodiments, the second insulative material 180 comprises silicon dioxide.

Figure 1G:
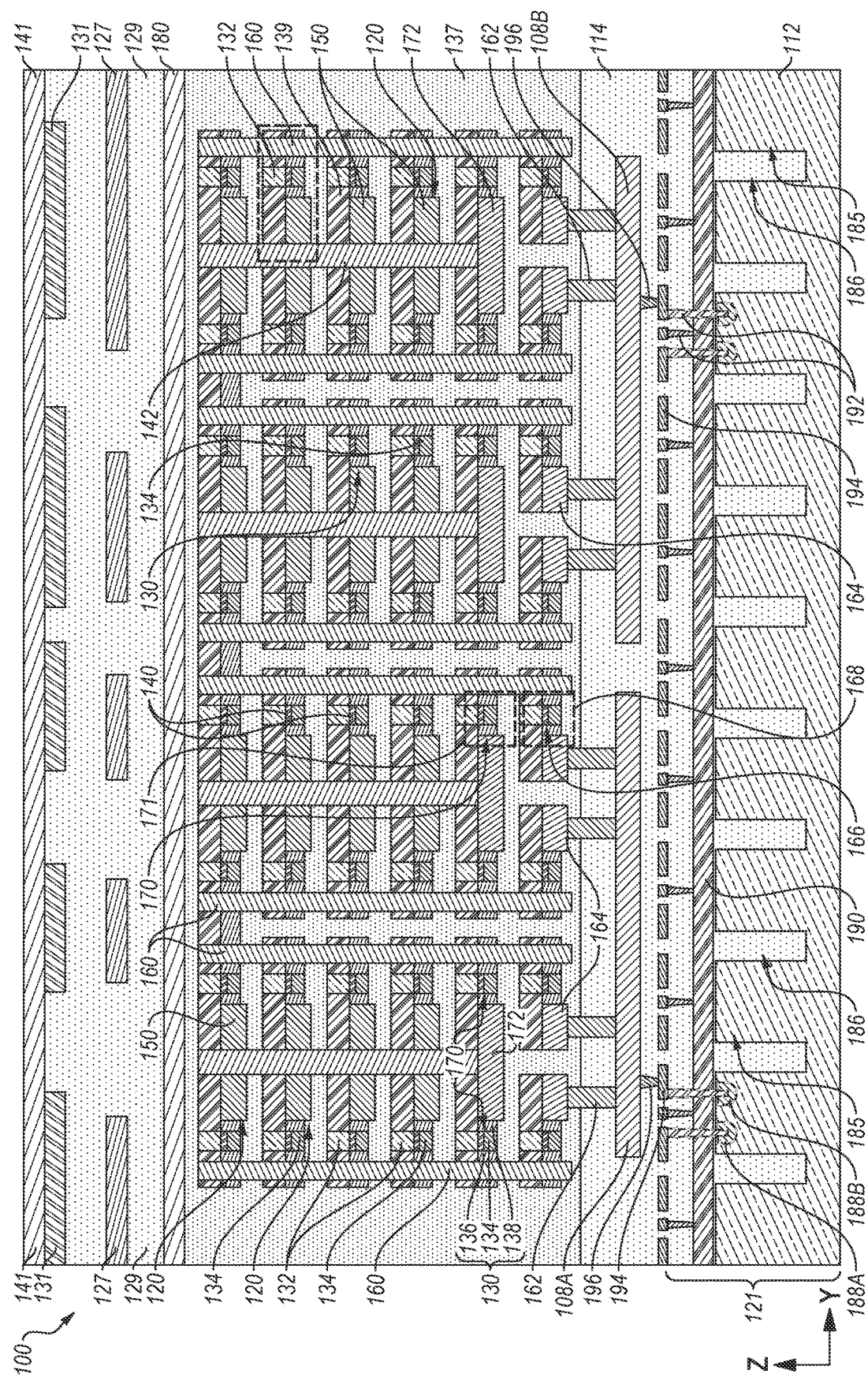
Figure 1H:
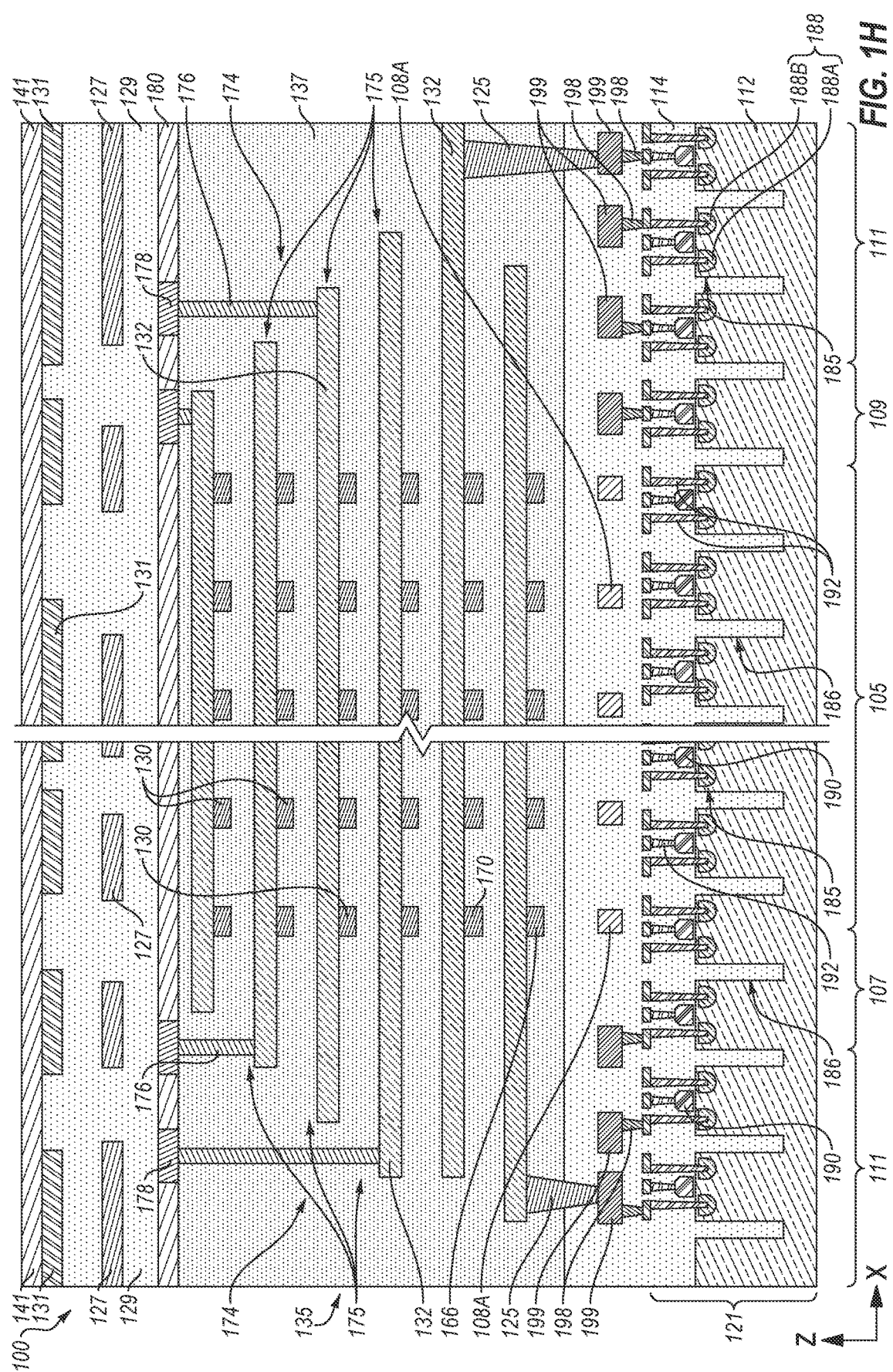
Figure 1I:
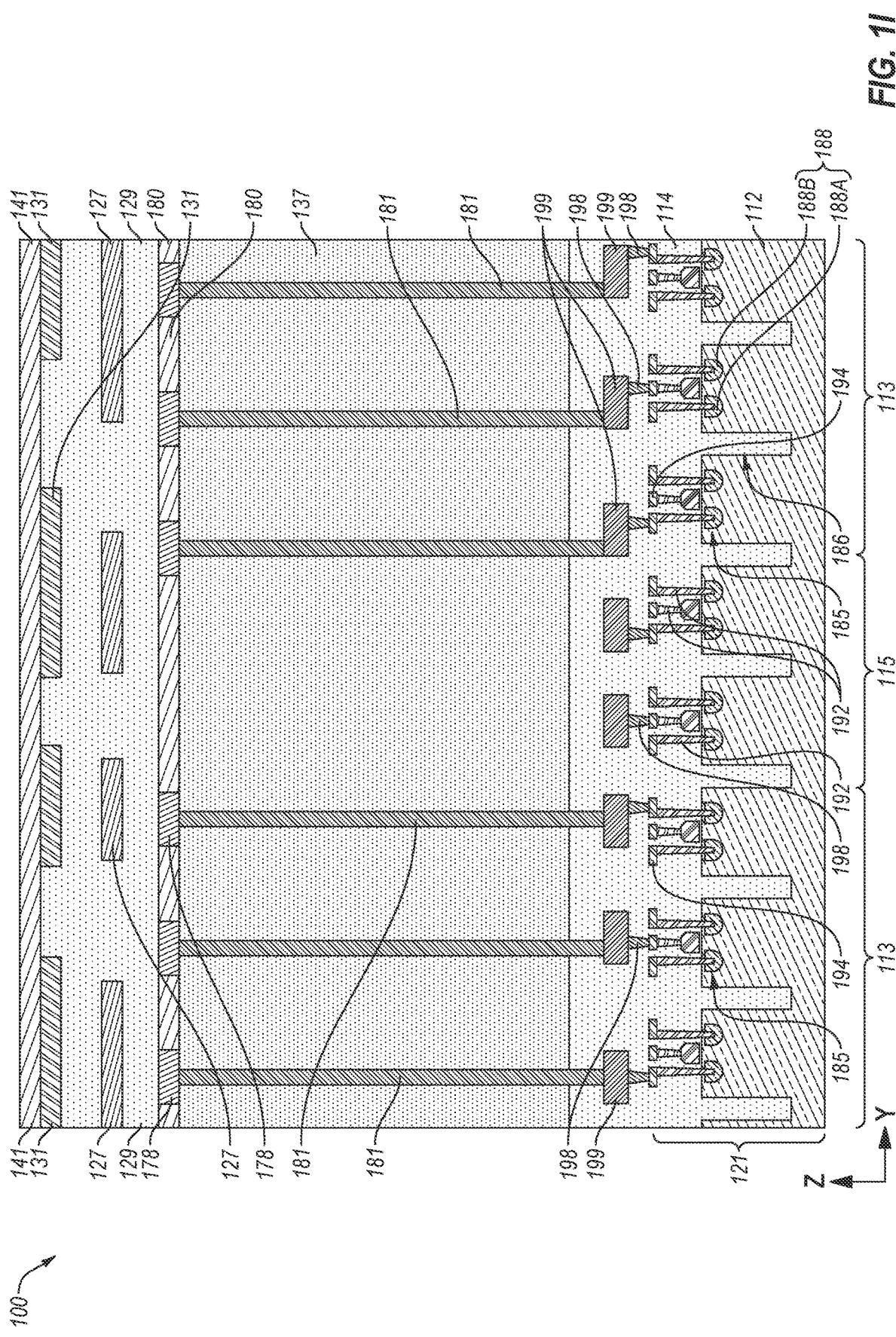
Figure 1J:
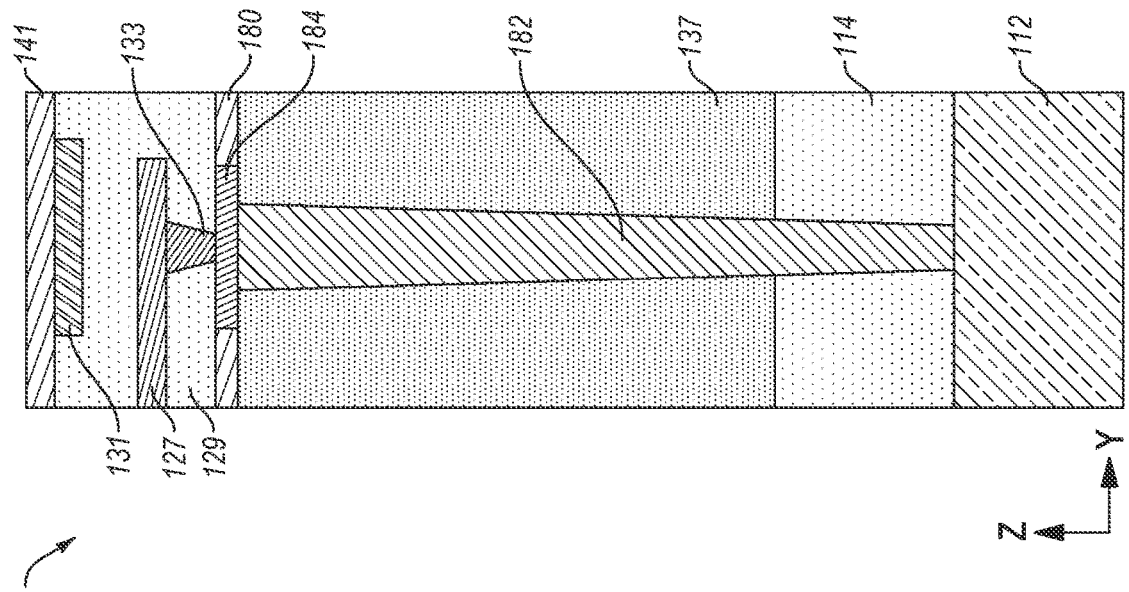

FIG. 1G is a simplified partial cross-sectional view of the first microelectronic device structure 100 illustrating the same cross-section as FIG. 1B; FIG. 1H is a simplified partial cross-sectional view of the first microelectronic device structure 100 illustrating the same cross-section as FIG. 1C; FIG. 1I is a simplified partial cross-sectional view of the first microelectronic device structure 100 illustrating the same cross-section as FIG. 1D; FIG. 1J is a simplified partial cross-sectional view of the first microelectronic device structure 100 illustrating the same cross-section as FIG. 1E; and FIG. 1K is a simplified partial cross-sectional view of the first microelectronic device structure 100 illustrating the same cross-section as FIG. 1F.

Figure 1K:
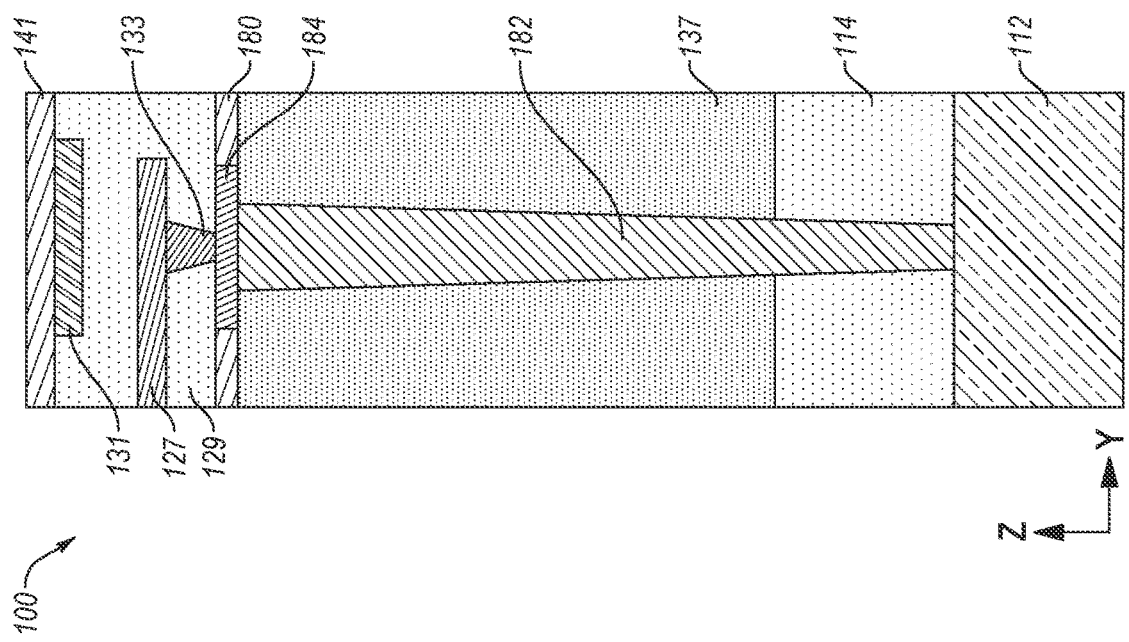

With collective reference to FIG. 1G through FIG. 1K, second pad structures 127 may be formed within a third insulative material 129 and vertically over (e.g., in the Z-direction) the vertical stacks of memory cells 120 (FIG. 1G), the stack structures 135 (FIG. 1H) including the staircase structures 174 (FIG. 1H), the third routing structures 178 (FIG. 1H, FIG. 1I), and the first pad structures 184 (FIG. 1J, FIG. 1K). First sacrificial structures 131 may be formed within the third insulative material 129 and vertically over (e.g., in the Z-direction) the second pad structures 127 in one or more of (e.g., each of) the memory array region 101 (e.g., within horizontal boundaries of the first sense amplifier device region 105, the first column decoder region 107, and the first sense amplifier driver region 109), and the peripheral regions 103 (e.g., within horizontal boundaries of one or more of the one or more first multiplexer controller regions 111, the one or more first sub word line driver regions 113, the one or more first row decoder device regions 115, and the one or more first CMOS device and socket regions 117). A fourth insulative material 141 may vertically overlie (e.g., in the Z-direction) the first sacrificial structures 131.

With reference to FIG. 1J and FIG. 1K, within the one or more first CMOS device and socket regions 117, at least some of the second pad structures 127 are in electrical communication with the first pad structures 184 by means of seventh conductive interconnect structures 133. In some embodiments, the second pad structures 127 within other regions of the first microelectronic device structure 100 (e.g., within horizontal boundaries of one or more of the first sense amplifier device region 105, the first column decoder region 107, the first sense amplifier driver region 109, the one or more first multiplexer controller regions 111, the one or more first sub word line driver regions 113, and the one or more first row decoder device regions 115) may be in electrical communication with one or more other components of the first microelectronic device structure in a cross-section other than that illustrated in FIG. 1G through FIG. 1I.

As will be described herein, the first sacrificial structures 131 may be used to form conductive structures (e.g., conductive routing structures and conductive pad structures 304 (FIG. 3G through FIG. 3J)) for forming an electrical connection individually between the first microelectronic device structure 100 and a second microelectronic device structure (e.g., second microelectronic device structure 200).

The first sacrificial structures 131 may be formed of and include a sacrificial material. The first sacrificial structures 131 may exhibit etch selectivity with respect to the third insulative material 129 and the fourth insulative material 141 during material exposure to a given etchant species. In some embodiments, the first sacrificial structures 131 exhibit etch selectivity with respect to the second pad structures 127 and the seventh conductive interconnect structures 135. In some embodiments, the first sacrificial structures 131 comprise a nitride material, such as silicon nitride. In other embodiments, the first sacrificial structures 131 comprise polysilicon. However, the disclosure is not so limited and the first sacrificial structures 131 may comprise one or more different materials.

The second pad structures 127 may be individually formed of and include conductive material, such as one or more of the materials described above with reference to the first pad structures 184, n some embodiments, the second pad structures 127 individually comprise tungsten. In other embodiments, the second pad structures 127 individually comprise copper.

The seventh conductive interconnect structures 135 may individually be formed of and include conductive material, such as one or more of the materials described above with reference to the first conductive interconnect structures 192. In some embodiments, the seventh conductive interconnect structures 135 individually comprise tungsten. In other embodiments, the seventh conductive interconnect structures 135 individually comprise copper.

The third insulative material 129 and the fourth insulative material 141 may individually be formed of insulative material, such as one or more of the materials described above with reference to the first insulative material 114. In some embodiments, the third insulative material 129 and the fourth insulative material 141 are individually formed of and include silicon dioxide.

After forming the fourth insulative material 141, the fourth insulative material 141 may be exposed to a chemical mechanical planarization (CMP) process to form a substantially planar upper (e.g., in the Z-direction) surface of the fourth insulative material 141. In some embodiments, the CMP process is configured to stop on the fourth insulative material 141 without exposing vertically (e.g., in the Z-direction) upper surfaces of the first sacrificial structures 131.

FIG. 2A through FIG. 2F are a simplified partial top-down view (FIG. 2A) and simplified partial cross-sectional views (FIG. 2B through FIG. 2F) illustrating a second microelectronic device structure 200 (e.g., a memory device, such as a 3D DRAM memory device), in accordance with embodiments of the disclosure. Components of the second microelectronic device structure 200 that are similar to corresponding components of the first microelectronic device structure 100 may retain the same numerical designation, except that reference numerals 1XX are replaced with 2XX. Put another way, in FIG. 2A through FIG. 2F and the associated description, features (e.g., structures, materials, devices, regions) of the second microelectronic device structure 200 functionally similar to previously described features (e.g., structures, materials, devices, regions) of the first microelectronic device structure 100 described with reference to FIG. 1A through FIG. 1K are referred to with similar reference numerals incremented by 100. To avoid repetition, not all features shown in FIG. 2A through FIG. 2F are described in detail herein. Rather, unless described otherwise below, in FIG. 2A through FIG. 2F, a feature designated by a reference numeral that is a 100 increment of the reference numeral of a feature previously described with reference to one or more of FIG. 1A through FIG. 1K will be understood to be substantially similar to the previously described feature. By way of non-limiting example, unless described otherwise below, a feature designated by the reference numeral 230 in FIGS. 2A and 2B will be understood to be substantially similar to one of the access devices 130 (including the channel material 134, the source material 136, and the drain material 138 thereof) previously described herein with reference to FIG. 1A and FIG. 1B. The second microelectronic device structure 200 may also be referred to herein as a second die or a second semiconductive wafer.

The second microelectronic device structure 200 may be substantially similar to the first microelectronic device structure 100, except that the second microelectronic device structure 200 may include one or more regions (e.g., a second CMOS device and socket regions 217) different than a corresponding region (e.g., one of the first CMOS device and socket regions 117) of the first microelectronic device structure 100. In some embodiments, the second microelectronic device structure 200 has about the same horizontal area (e.g., in the X-direction, in the Y-direction) the first microelectronic device structure 100.

With reference to FIG. 2A, the second microelectronic device structure 200 includes a second array region 201 (also referred to herein as a "second memory array region") and one or more peripheral regions 203 located external to the second array region 201. In some embodiments, the peripheral regions 203 horizontally (e.g., in at least X-direction) surround the second array region 201, as described above with reference to the peripheral regions 103 (FIG. 1A) and the first array region 101 (FIG. 1A).

The second array region 201 may be substantially the same as the first array region 101 (FIG. 1A). For example, the second array region 201 may include a second sense amplifier device region 205, a second column decoder region 207, and a second sense amplifier driver region 209. The second column decoder region 207 may horizontally neighbor (e.g., in the X-direction) the second sense amplifier device region 205; and the second sense amplifier driver region 209 may horizontally neighbor (e.g., in the X-direction) the second sense amplifier device region 205 opposite the second column decoder region 207. In some embodiments, the second sense amplifier device region 205 horizontally intervenes (e.g., in the X-direction) between the second column decoder region 207 and the second sense amplifier driver region 209.

The peripheral regions 203 may include, for example, one or more second multiplexer controller regions 211, one or more second sub word line driver regions 213, one or more second row decoder device regions 215, and one or more second CMOS device and socket regions 217, and an input/output device region 219. In some embodiments, one of the second multiplexer controller regions 211 horizontally neighbors (e.g., in the X-direction) the second column decoder region 207 and an additional one of the second multiplexer controller regions 211 horizontally neighbors (e.g., in the X-direction) the second sense amplifier driver region 209. In some embodiments, the second multiplexer controller regions 211 are substantially coextensive (e.g., in the Y-direction) with one or more of (e.g., each of) the second sense amplifier device region 205, the second column decoder region 207, and the second sense amplifier driver region 209.

Each of the second sense amplifier device region 205, the second column decoder region 207, the second sense amplifier driver region 209, the one or more second multiplexer controller regions 211, the one or more second sub word line driver regions 213, and the one or more second row decoder device regions 215 may be substantially the same and include devices and circuitry substantially the same as the respective first sense amplifier driver region 105 (FIG. 1A, FIG. 1H), the first column decoder region 107 (FIG. 1A, FIG. 1H), the first sense amplifier driver region 109 (FIG. 1A, FIG. 1H), the one or more first multiplexer controller regions 111 (FIG. 1A, FIG. 1H), the one or more first sub word line driver regions 113 (FIG. 1A, FIG. 1I), and the one or more first row decoder device regions 115 (FIG. 1A, FIG. 1I) of the first microelectronic device structure 100 (FIG. 1A and FIG. 1G through FIG. 1I).

The second microelectronic device structure 200 includes a second control logic device region 221 vertically below (e.g., in the Z-direction) the vertical stack of memory cells 220 of the second array region 201 of the second microelectronic device structure 200. The second control logic device region includes each of the second sense amplifier device region 205, the second column decoder region 207, the second sense amplifier driver region 209, the second multiplexer controller regions 211, the second sub word line driver regions 213, and the second row decoder device regions 215 individually including transistor structures 285 formed within a second base structure 212 and vertically between (e.g., in the Z-direction) the second base structure 212 and the vertical stacks of memory cells 220, as described above with reference to the first control logic device region 121 (FIG. 1G through FIG. 1I).

In some embodiments, the second CMOS device and socket region 217 is substantially the same and includes at least some devices and circuitry substantially the same as the one or more first CMOS device and socket regions 117 (FIG. 1A, FIG. 1J, FIG. 1K). By way of non-limiting example, the second CMOS device and socket region 217 may include one or more control logic devices configured for effectuating control operations of one or more of the memory cells 220 of the second microelectronic device structure 200, one or more (e.g., each) of charge pumps (e.g., $V_{CCP}$ charge pumps, $V_{NEGWL}$ charge pumps, DVC2 charge pumps), decoupling capacitors, voltage generators, power supply terminals, drain supply voltage ($V_{DD}$) regulators, decoders (e.g., local deck decoders), repair circuitry (e.g., column repair circuitry, row repair circuitry), memory test devices, array multiplexers (MUX), and error checking and correction (ECC) devices, self-refresh/wear leveling devices, page buffers, data paths, I/O devices (e.g., local I/O devices) and controller logic (timing circuitry, clock devices (e.g., a global clock device)), deck enable, read/write circuitry, address circuitry, or other logic devices and circuitry, and various chip/deck control circuitry.

In some embodiments, the second CMOS device and socket region 217 includes one or more devices and circuitry different than the devices and circuitry of the first CMOS device and socket region 117. The second CMOS device and socket region 217 may include one or more devices that are speed critical and are configured to be located proximate a back end of line (BEOL) region of the microelectronic device (e.g., microelectronic device 350 (FIG. 3K through FIG. 3O)) to be formed from the first microelectronic device structure 100 and the second microelectronic device structure 200. By way of non-limiting example, the second CMOS device and socket region 217 may include one or more of (e.g., each of) delay-locked loop (DLL) circuitry (e.g., ring oscillators), one or more data output devices (e.g., DQU, DQL), data input/output terminals (e.g., DQ pins, DQ pads), drain supply voltage ($V_{DD}$) regulators.

As described in further detail herein, the second CMOS device and socket region 217 is electrically connected to one or more components of the first microelectronic device structure 100 (e.g., one or more components and devices within one or more of the first CMOS device and socket regions 117) to electrically connect one or more components and devices of the first microelectronic device structure 100 to, for example, input/output devices of a microelectronic device (e.g., microelectronic device 350 (FIG. 3K through FIG. 3O)) formed from the first microelectronic device structure 100 and the second microelectronic device structure 200.

As described in further detail herein, the input/output device region 219 may be configured to be electrically coupled to input/output devices and electrically connect to, for example, one of the first CMOS device and socket regions 117 of the first microelectronic device structure 100 to electrically connect the second microelectronic device structure 200 to the first microelectronic device structure 100.

The second microelectronic device structure 200 may include second sacrificial structures 231 substantially similar to the first sacrificial structures 131 (FIG. 1G through FIG. 1I). The second sacrificial structures 231 may be formed of and include one or more of the materials described above with reference to the first sacrificial structures 131. In some embodiments, the second sacrificial structures 231 comprise substantially the same material composition as the first sacrificial structures 131. In some embodiments, the second sacrificial structures 231 individually comprise silicon nitride. The second sacrificial structures 231 may exhibit an etch selectivity with respect to, for example, a fifth insulative material 241, the first insulative material 114, the insulative structures 137, and the second insulative material 180, and the third insulative material 129.

The fifth insulative material 241 may be formed of and include one or more insulative materials, such as one or more of the materials described above with reference to the first insulative material 114. In some embodiments, the fifth insulative material 241 comprises silicon dioxide.

Figure 2F:
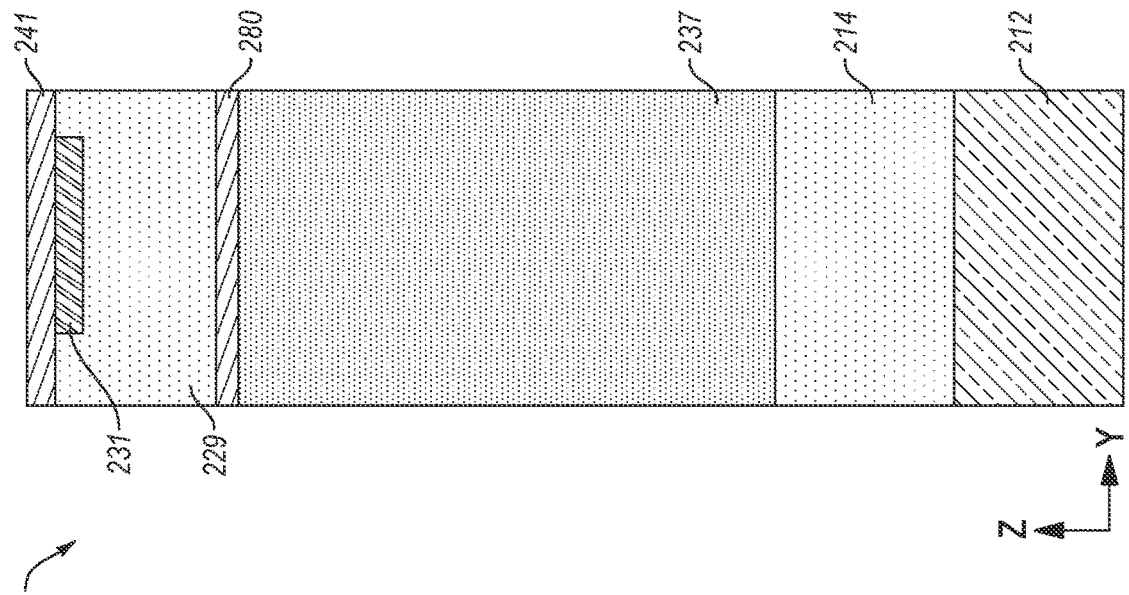
Figure 2E:
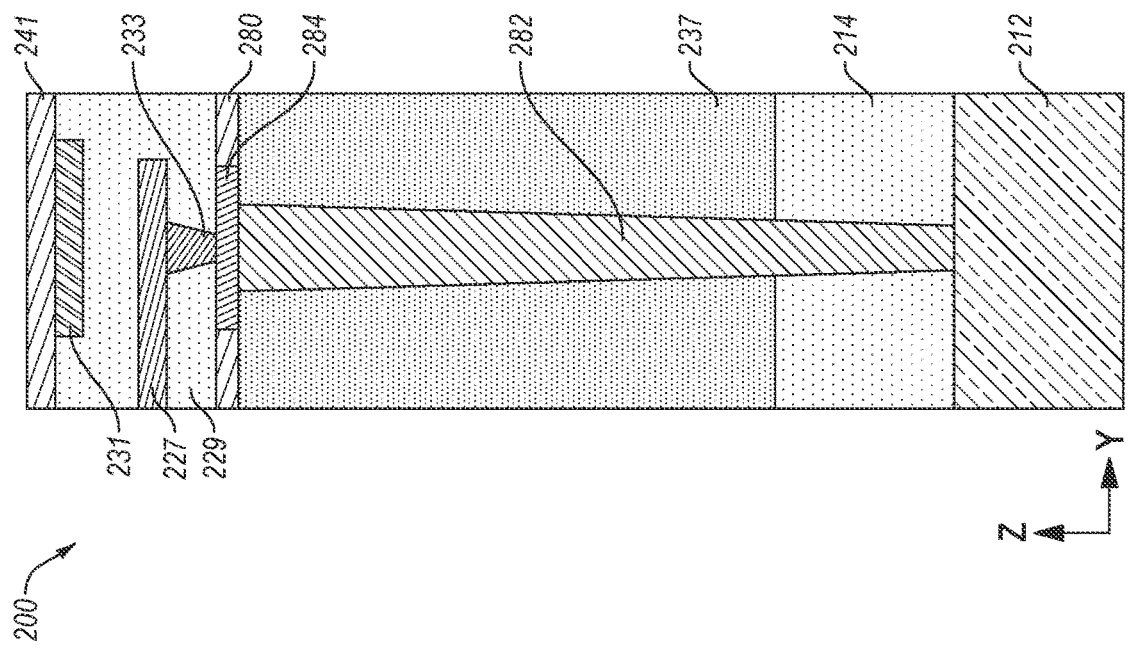
Figure 3A:
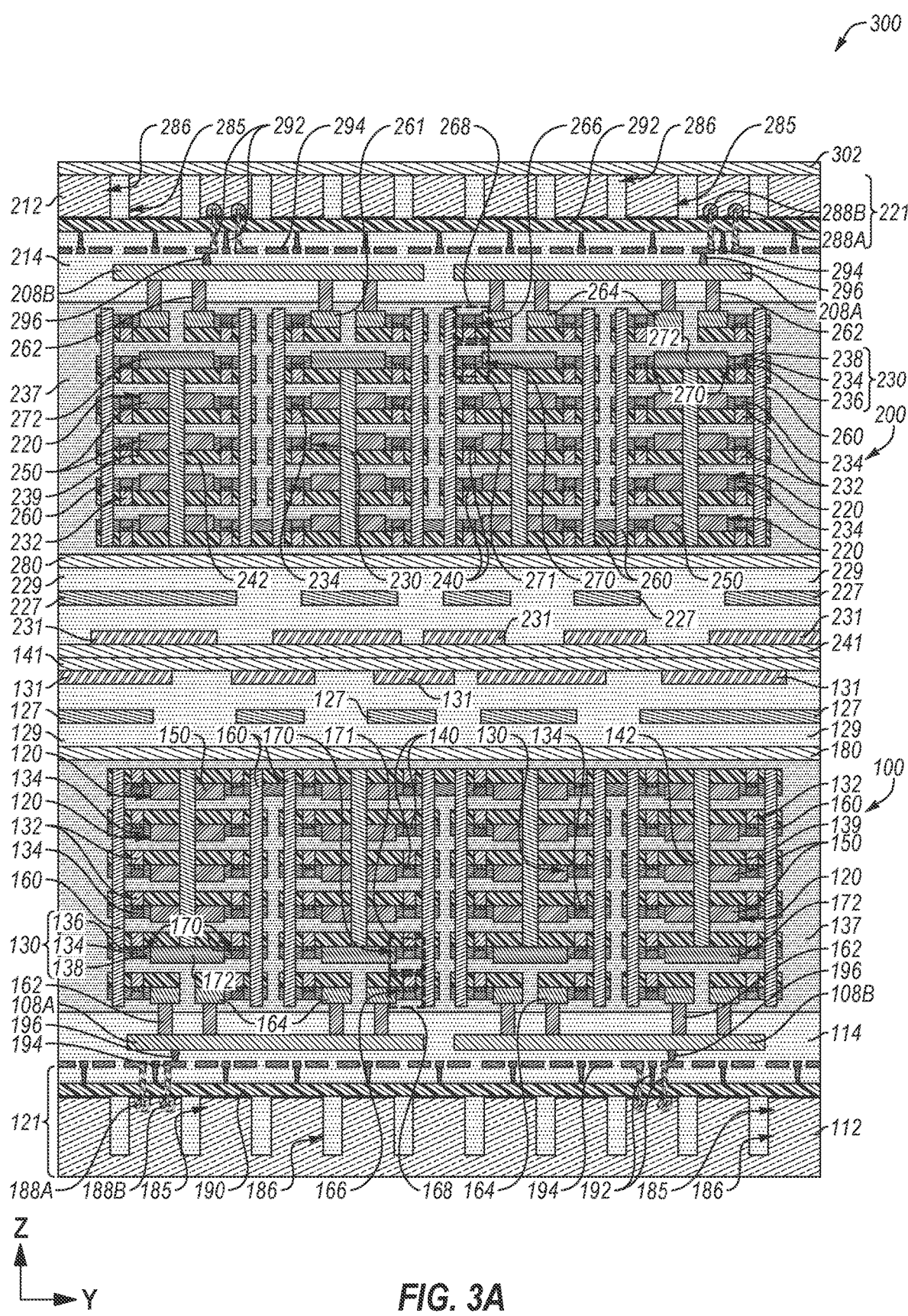
FIG. 3A through FIG. 3O are simplified, partial cross-sectional views illustrating a method of forming a microelectronic device from the first microelectronic device structure of FIG. 1A through FIG. 1K and the second microelectronic device structure of FIG. 2A through FIG. 2F.
Figure 3B:
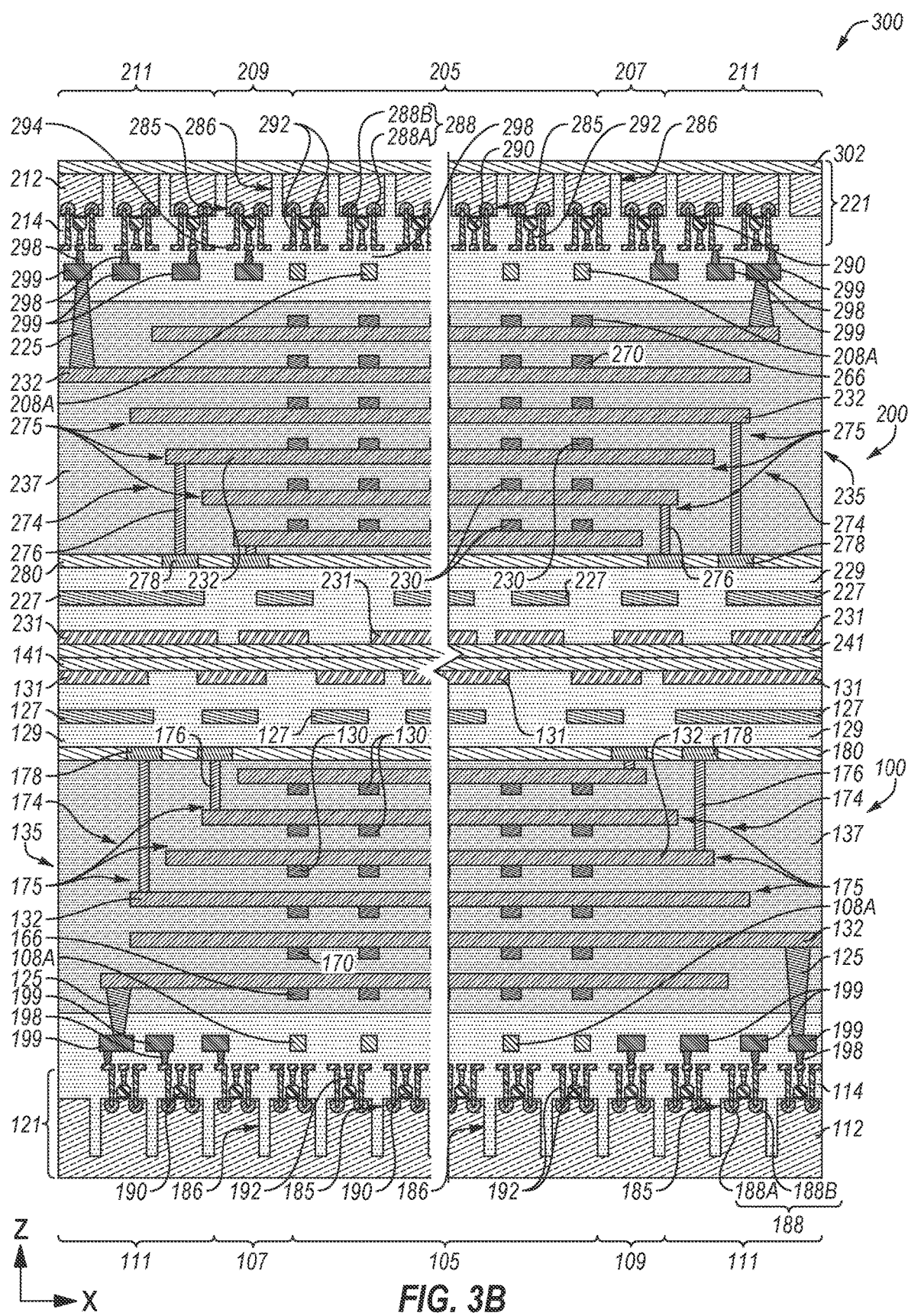
Figure 3C:
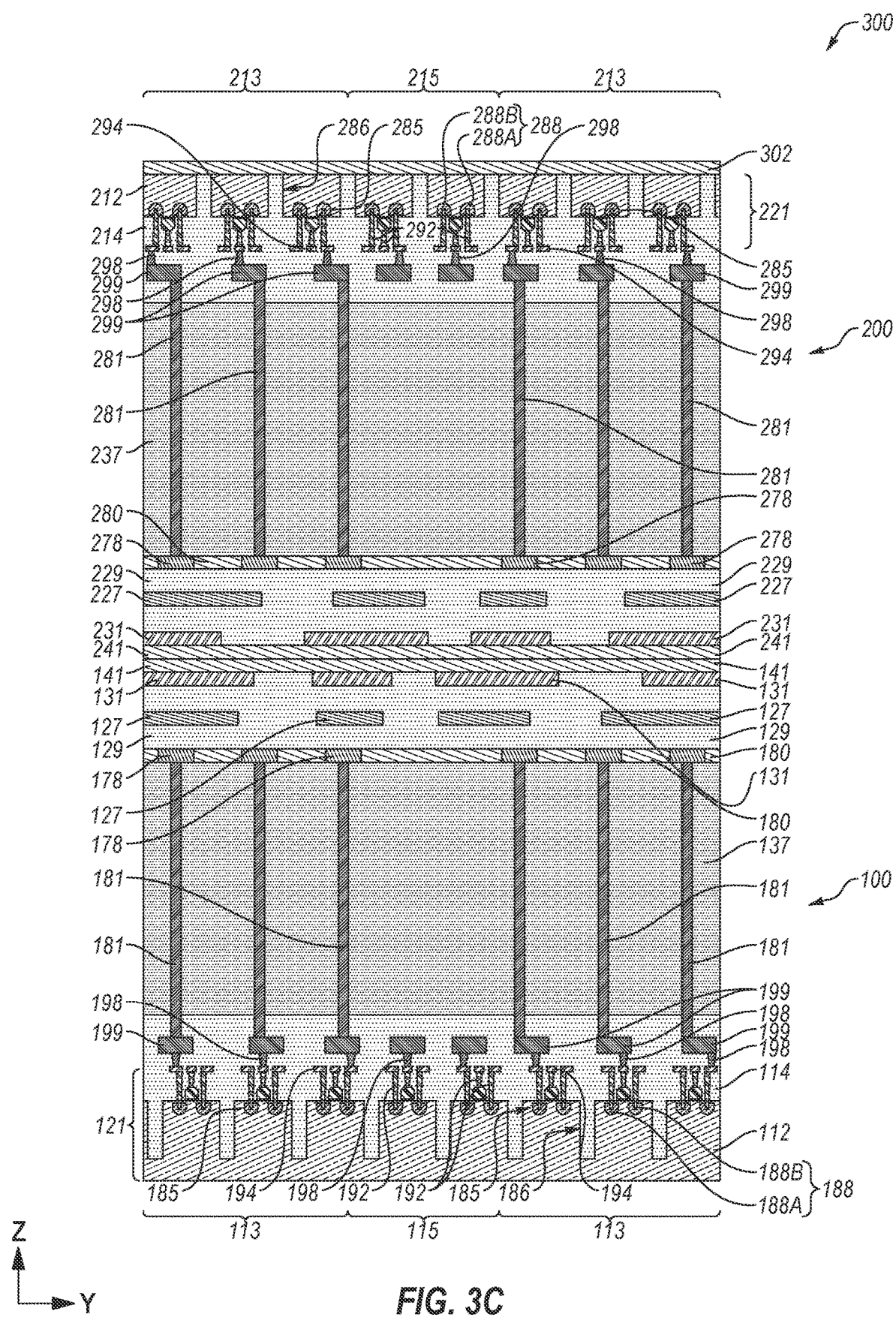
Figure 3D:
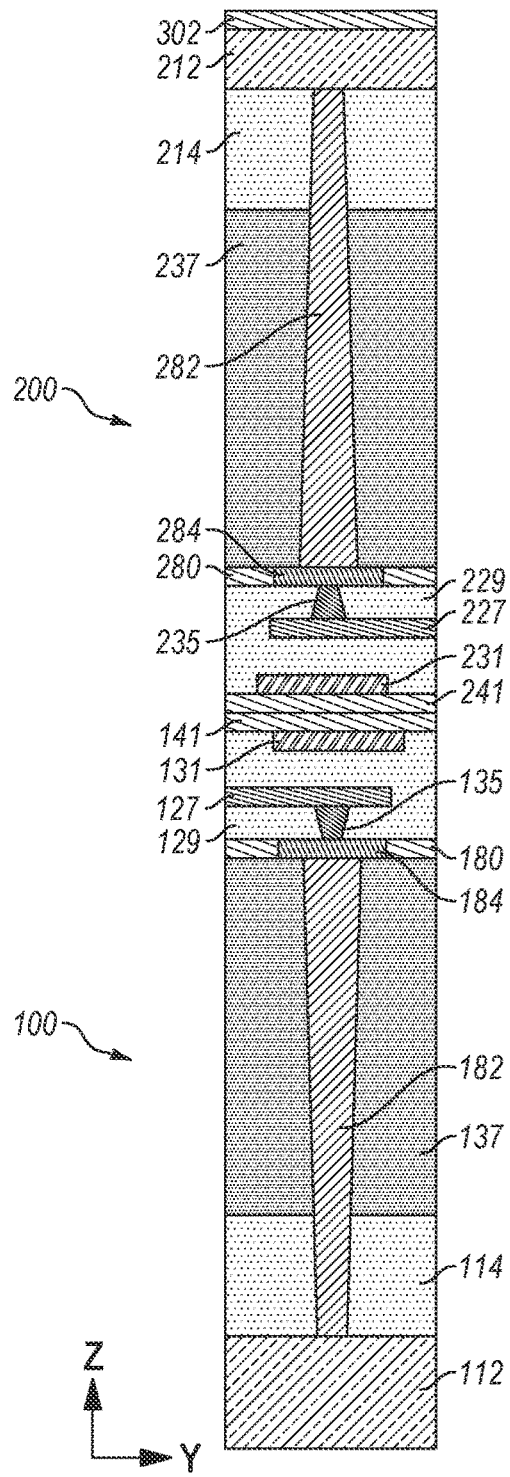
Figure 3E:
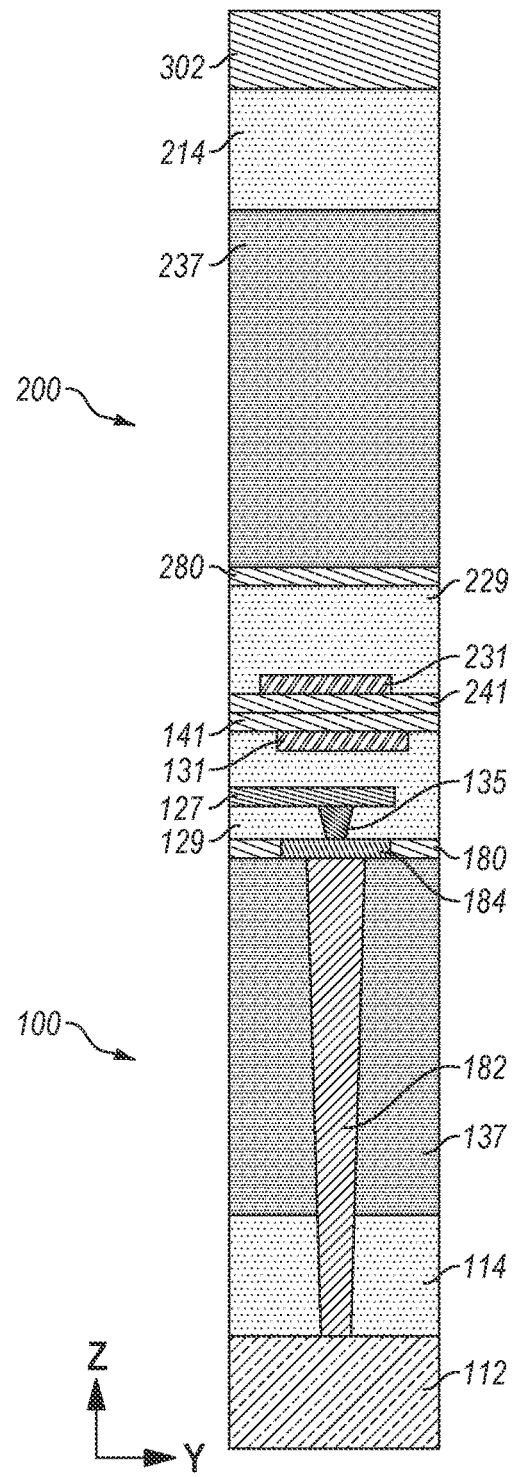

Referring to FIG. 3A through FIG. 3E, the second microelectronic device structure 200 may be vertically (e.g., in the Z-direction) inverted (e.g., flipped) and attached to the first microelectronic device structure 100 to form a microelectronic device structure assembly 300 comprising the first microelectronic device structure 100 and the second microelectronic device structure 200 attached to the first microelectronic device structure 100. FIG. 3A illustrates the same cross-sectional view of the first microelectronic device structure 100 illustrated in FIG. 1G and the second microelectronic device structure 200 of FIG. 2B; FIG. 3B illustrates the same cross-sectional view of the first microelectronic device structure 100 illustrated in FIG. 1H and the second microelectronic device structure 200 of FIG. 2C; FIG. 3C illustrates the same cross-sectional view of the first microelectronic device structure 100 illustrated in FIG. 1I and the second microelectronic device structure 200 of FIG. 2D; FIG. 3D illustrates the same cross-sectional view of the first microelectronic device structure 100 illustrated in FIG. 1J and the second microelectronic device structure 200 of FIG. 2E; and FIG. 3E illustrates the same cross-sectional view of the first microelectronic device structure 100 illustrated in FIG. 1K and the second microelectronic device structure 200 of FIG. 2F.

In some embodiments, the second microelectronic device structure 200 is flipped (e.g., vertically flipped), and the fifth insulative material 241 of the second microelectronic device structure 200 is bonded to the fourth insulative material 141 of the first microelectronic device structure 100 to attach the first microelectronic device structure 100 to the second microelectronic device structure 200 and form the microelectronic device structure assembly 300.

The second microelectronic device structure 200 may be attached to the first microelectronic device structure 100 by placing the fifth insulative material 241 in contact with the fourth insulative material 141 and exposing the second microelectronic device structure 200 and the first microelectronic device structure 100 to annealing conditions to form bonds (e.g., oxide-to-oxide bonds) between the fifth insulative material 241 in contact with the fourth insulative material 141. In some embodiments, the second microelectronic device structure 200 and the first microelectronic device structure 100 are exposed to a temperature greater than, for example, 800° C., to form the oxide-to-oxide bonds and attach the second microelectronic device structure 200 to the first microelectronic device structure 100.

Attaching the second microelectronic device structure 200 to the first microelectronic device structure 100 may include horizontally aligning (e.g., in the X-direction, in the Y-direction) the second array region 201 with the first array region 101 and the one or more peripheral regions 203 of the second microelectronic device structure 200 with the one or more peripheral regions 103 of the first microelectronic device structure 100. By way of non-limiting example, in some embodiments, the second sense amplifier device region 205 is horizontally aligned with the first sense amplifier device region 105; the second column decoder region 207 is horizontally aligned with (e.g., located within horizontal boundaries of) the first sense amplifier driver region 109; the second sense amplifier driver region 209 is horizontally aligned with (e.g., located within horizontal boundaries of) the first column decoder region 107; the one or more second multiplexer controller regions 211 are horizontally aligned with (e.g., located within horizontal boundaries of) the one or more first multiplexer controller regions 111; the one or more second sub word line driver regions 213 are horizontally aligned with (e.g., located within horizontal boundaries of) the one or more first sub word line driver regions 113; and the one or more second row decoder device regions 215 are horizontally aligned with (e.g., located within horizontal boundaries of) the one or more first row decoder device regions 115. In other embodiments, the second column decoder region 207 is horizontally aligned with (e.g., located within horizontal boundaries of) the first column decoder region 107; and the second sense amplifier driver region 209 is horizontally aligned with (e.g., located within horizontal boundaries of) the first sense amplifier driver region 109. In some such embodiments, a location of the second column decoder region 207 and the second sense amplifier driver region 209 may be flipped with respect to that illustrated in FIG. 2C.

In some embodiments, the second CMOS device and socket region 217 is horizontally aligned with (e.g., located within horizontal boundaries of) one of the first CMOS device and socket regions 117; and the input/output device region 219 is horizontally aligned with (e.g., located within horizontal boundaries of) another of the first CMOS device and socket regions 117.

In some embodiments, the vertical stacks of memory cells 220 of the second microelectronic device structure 200 are horizontally aligned (e.g., in the X-direction, in the Y-direction) with (e.g., located within horizontal boundaries of) the vertical stacks of memory cells 120 of the first microelectronic device structure 100. In some embodiments, the stack structures 235 and the staircase structures 274 of the second microelectronic device structure 200 are horizontally aligned with (e.g., located within horizontal boundaries of) the stack structures 135 and the staircase structures 174 of the first microelectronic device structure 100.

With continued reference to FIG. 3A through FIG. 3E, after attaching the second microelectronic device structure 200 to the first microelectronic device structure 100, the second base structure 212 may be vertically (e.g., in the Z-direction) thinned by exposing the second base structure 212 to a chemical mechanical planarization (CMP) process. In other embodiments, the second base structure 212 is vertically thinned by exposing the second base structure 212 to a dry etch. Vertically thinning the second base structure 212 may electrically isolate the transistor structures 185 of the second control logic device region 221 of the second base structure 212 from one another.

After vertically (e.g., in the Z-direction) thinning the second base structure 212, the second base structure 212 may have a vertical thickness (e.g., in the Z-direction) within a range of from about 500 nm to about 800 nm, such as from about 550 nm to about 750 nm, or from about 600 nm to about 700 nm. However, the disclosure is not so limited and the vertical thickness of the second base structure 212 may be different than that described.

In some embodiments, the second base structure 212 may be removed from within the input/output device region 219 (illustrated in FIG. 3E) to expose a portion of the first insulative material 214 of the second microelectronic device structure 200 within the input/output device region 219. After removing the first insulative material 214 of the second microelectronic device structure 200 within the input/output device region 219, a sixth insulative material 302 is formed vertically over (e.g., in the Z-direction) the second microelectronic device structure 200, such as over the second sense amplifier device region 205 (FIG. 2B, FIG. 2C), the second column decoder region 207 (FIG. 2C), the second sense amplifier driver region 209 (FIG. 2C), the one or more second multiplexer controller regions 211 (FIG. 2C), the one or more second sub word line driver regions 213 (FIG. 2D), the one or more second row decoder device regions 215 (FIG. 2D), at least one of the second CMOS device and socket regions 217 (FIG. 2E), and the input/output device region 219 (FIG. 2F). In some embodiments, the sixth insulative material has a greater vertical (e.g., in the Z-direction) dimension in the input/output device region 219 than in other regions of the second microelectronic device structure 200.

The sixth insulative material 302 may be formed of and include one or more insulative materials, such as one or more of the materials described above with reference to the first insulative material 114. In some embodiments, the sixth insulative material 302 comprises silicon dioxide.

Figure 3F:
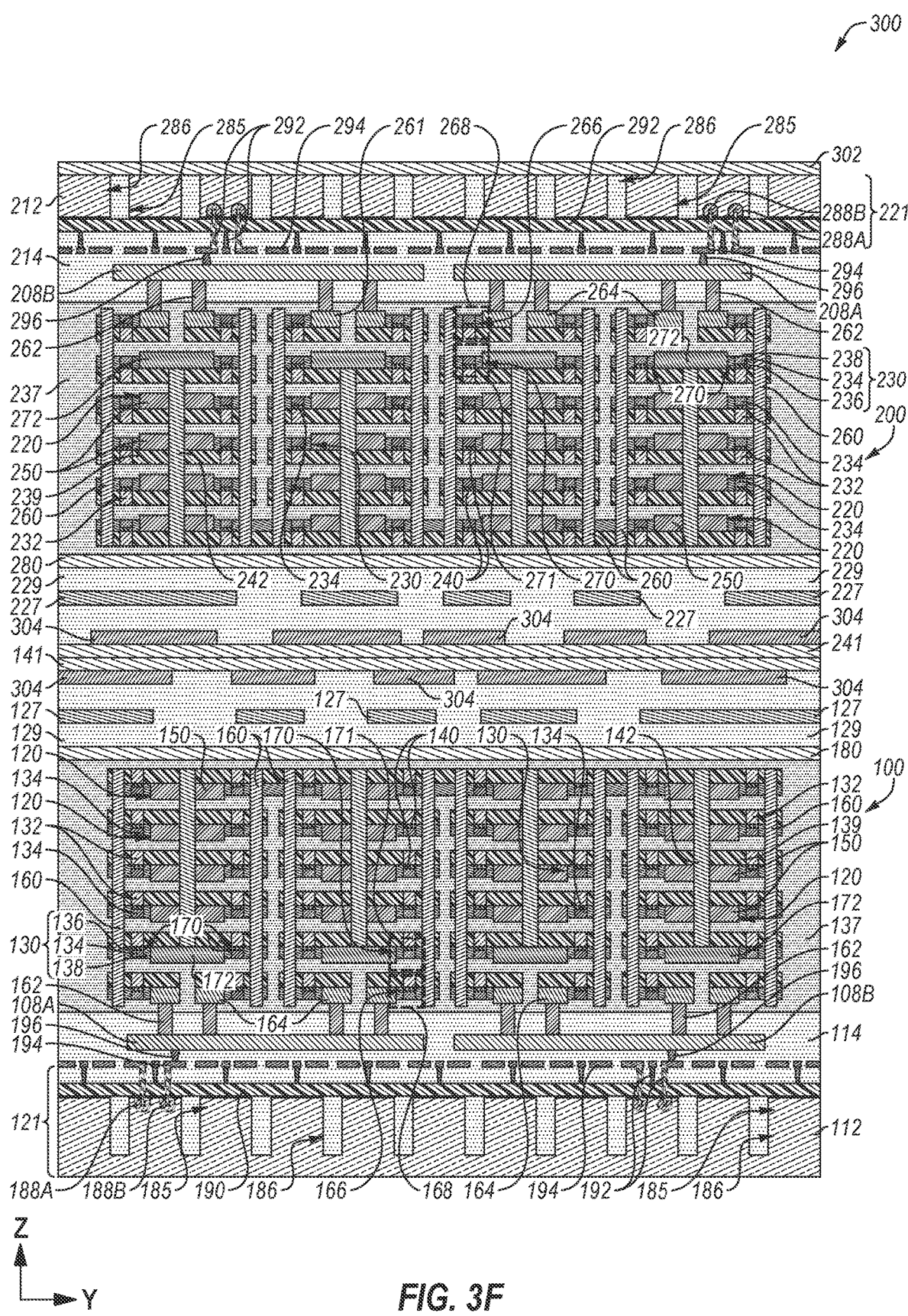
Figure 3G:
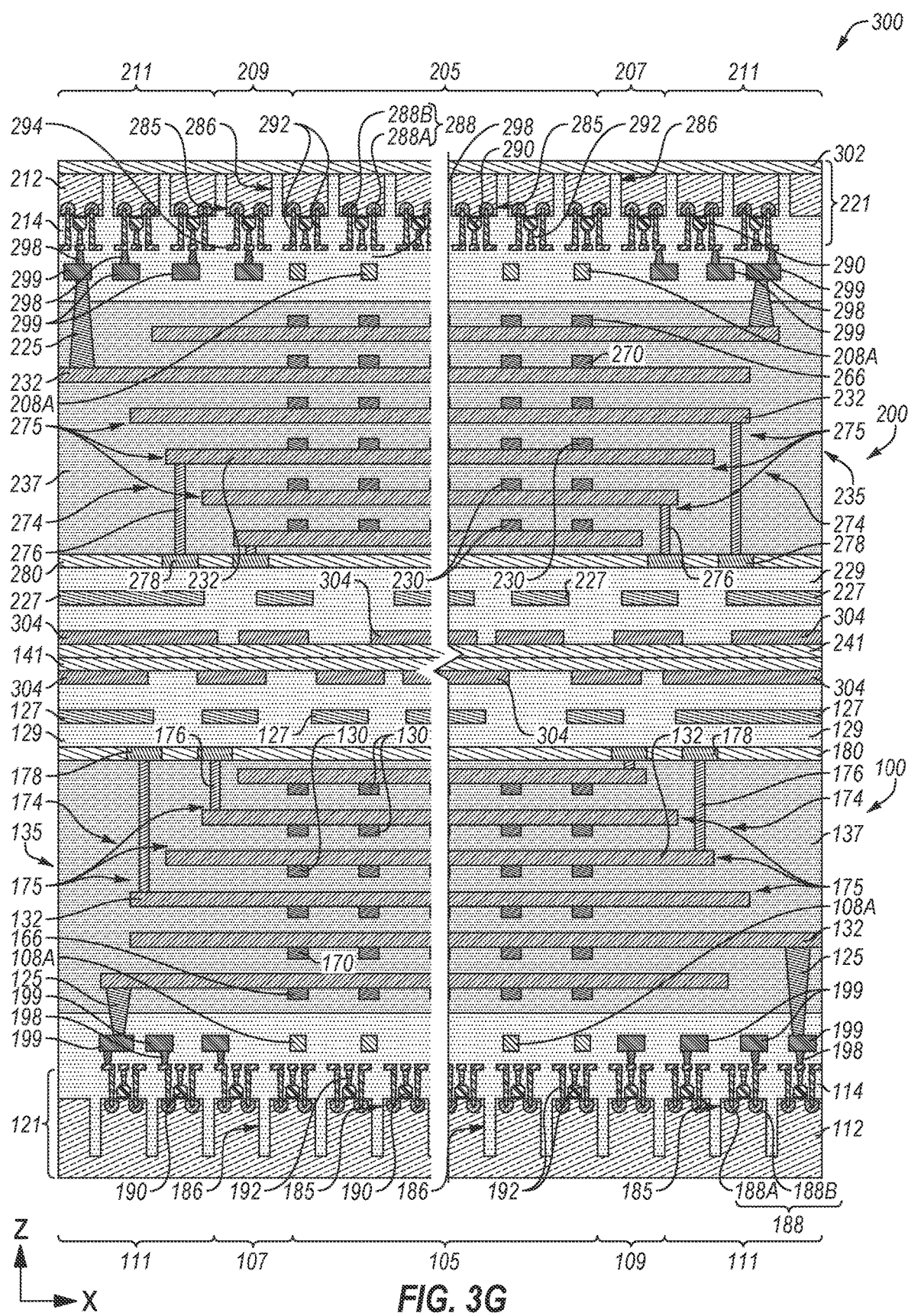
Figure 3H:
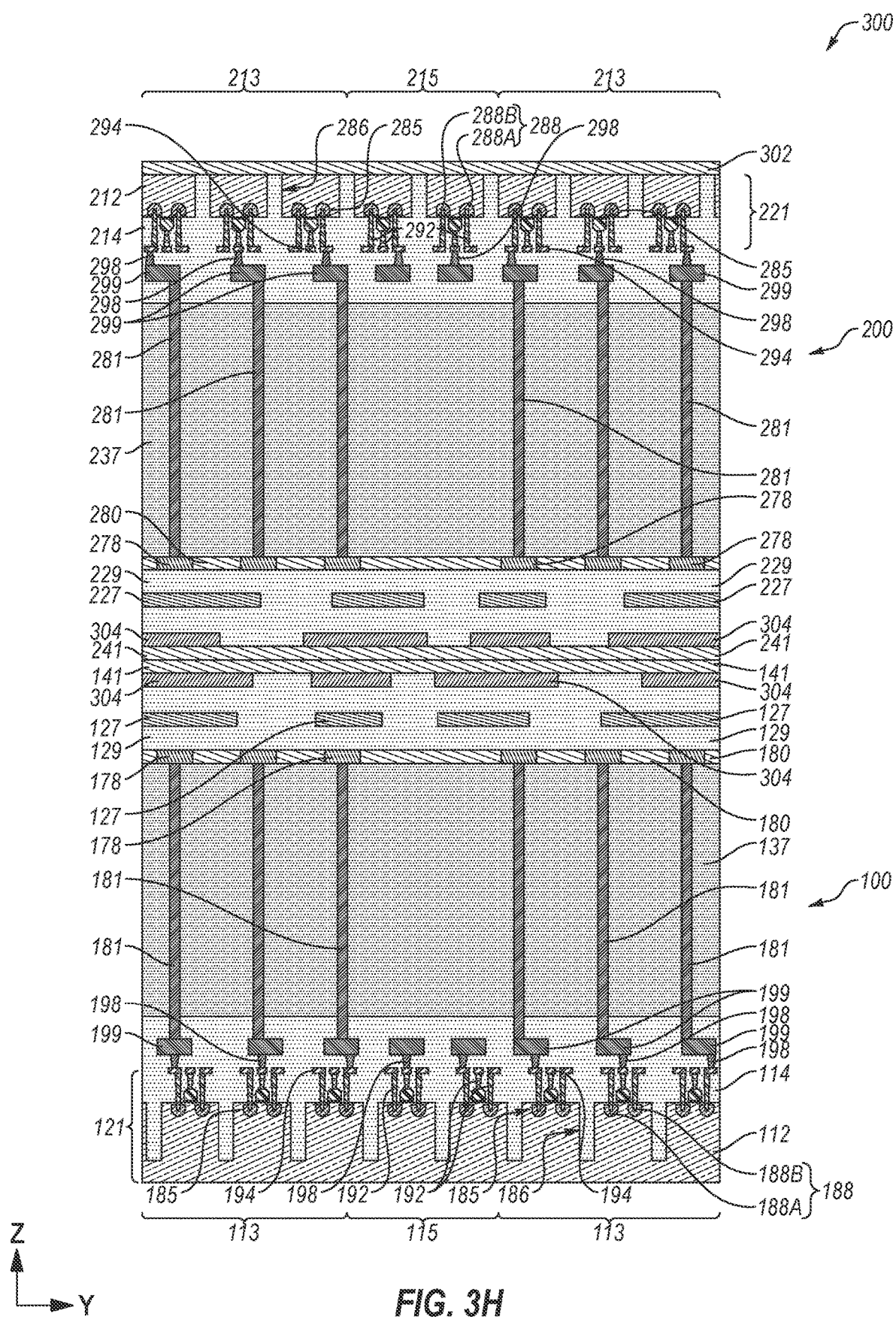

FIG. 3F is a simplified partial cross-sectional view of the microelectronic device structure assembly 300 illustrating the same cross-sectional view as FIG. 3A; FIG. 3G is a simplified partial cross-sectional view of the microelectronic device structure assembly 300 illustrating the same cross-sectional view as FIG. 3CB; FIG. 3H is a simplified partial cross-sectional view of the microelectronic device structure assembly 300 illustrating the same cross-sectional view as FIG. 3C; FIG. 3I is a simplified partial cross-sectional view of the microelectronic device structure assembly 300 illustrating the same cross-sectional view as FIG. 3D; and FIG. 3J is a simplified partial cross-sectional view of the microelectronic device structure assembly 300 illustrating the same cross-sectional view as FIG. 3E.

With reference to FIG. 3F through FIG. 3J, openings may be formed with the input/output device region 219 (illustrated in FIG. 3J) vertically (e.g., in the Z-direction) through the sixth insulative material 302, portions of the second microelectronic device structure 200 (e.g., the first insulative material 214, the insulative structures 237, the second insulative material 280, the third insulative material 229, the second sacrificial structures 231, and the fifth insulative material 241 of the second microelectronic device structure 200) and at least a portion of the first microelectronic device structure 100 (e.g., the fourth insulative material 141, the first sacrificial structures 131, and the third insulative material 129 of the first microelectronic device structure 100). In some embodiments, at least a portion (e.g., sidewalls) of each of the second sacrificial structures 231 (FIG. 3A through FIG. 3E) and the first sacrificial structures 131 (FIG. 3A through FIG. 3E) are exposed through the openings. In some such embodiments, at least a portion of sidewalls defining the openings may be defined by the second sacrificial structures 231 and the first sacrificial structures 131.

The openings may be formed by exposing the microelectronic device structure assembly 300 to, for example, a dry etch chemistry, to selectively remove the portions of the second microelectronic device structure 200 and the first microelectronic device structure 100 and form the openings. In some embodiments, forming the openings in the input/output device region 219 includes exposing portions of the second pad structures 127 in the input/output device region 219. In some embodiments, the etch chemistry formulated and configured to selectively remove the portions of the second microelectronic device structure 200 and the first microelectronic device structure 100 does not substantially remove the conductive material of the second pad structures 227 (e.g., selectively removes the first insulative material 214, the insulative structures 237, the second insulative material 280, the third insulative material 229, the second sacrificial structures 231, and the fifth insulative material 241 of the second microelectronic device structure 200; and the fourth insulative material 141, the first sacrificial structures 131, and the third insulative material 129 of the first microelectronic device structure 100). Stated another way, the etch chemistry used to form the openings may be configured to stop on the second pad structures 227.

With continued reference to FIG. 3F through FIG. 3J, after forming the openings in the input/output device region 219, the second sacrificial structures 231 (FIG. 3A through FIG. 3E) and the first sacrificial structures 131 (FIG. 3A through FIG. 3E) may be selectively removed through the openings relative to the first insulative material 214 of the second microelectronic device structure 200, the insulative structures 237 of the second microelectronic device structure 200, the second insulative material 280 of the second microelectronic device structure 200, the third insulative material 229 of the second microelectronic device structure 200, the fifth insulative material 241 of the second microelectronic device structure 200, the fourth insulative material 141 of the first microelectronic device structure 100, and the third insulative material 129 of the first microelectronic device structure 100. In some embodiments, the first sacrificial structures 131 and the second sacrificial structures 231 within horizontal boundaries (e.g., in the X-direction, in the Y-direction) of each of the first array region 101, the second array region 201, and the one or more peripheral regions 103, 203 may be removed through the openings in the input/output device region 219. In some embodiments, the first sacrificial structures 131 and the second sacrificial structures 231 located outside of the input/output device region 219 may be in communication with the respective first sacrificial structures 131 and the second sacrificial structures 231 within the input/output device region 219. In some such embodiments, the first sacrificial structures 131 and the second sacrificial structures 231 outside of the input/output device region 219 may be removed through the openings within the input/output device region 219.

In some embodiments, the first sacrificial structures 131 and the second sacrificial structures 231 are selectively removed by exposing the openings to a wet etch chemistry formulated and configured to selective remove nitride materials (e.g., silicon nitride) relative to oxide materials (e.g., silicon dioxide). By way of non-limiting example, in some embodiments, the wet etch chemistry comprises phosphoric acid ($H_3PO_4$).

After selectively removing the first sacrificial structures 131 (FIG. 3A through FIG. 3E) and the second sacrificial structures 231 (FIG. 3A through FIG. 3E), voids remaining at locations corresponding to the first sacrificial structures 131 and the second sacrificial structures 231 may be filled with conductive material to form conductive routing structures and conductive pad structures 304 and voids at locations corresponding to the openings within the input/output device region 219 may be filled with conductive material to form eighth conductive interconnect structures 306 (FIG. 3J). In some embodiments, the eighth conductive interconnect structures 306 are in electrical communication with complementary metal-oxide-semiconductor devices of the first microelectronic device structure 100 (e.g., such as within one of the first complementary metal-oxide-semiconductor (CMOS) device and socket regions 117).

The eighth conductive interconnect structures 306 and the conductive routing structures and conductive pad structures 304 may individually be formed of and include conductive material, such as one or more of the materials described above with reference to the global digit lines 108. In some embodiments, the eighth conductive interconnect structures 306 and the conductive routing structures and conductive pad structures 304 are individually formed of and include copper. In other embodiments, the eighth conductive interconnect structures 306 and the conductive routing structures and conductive pad structures 304 are individually formed of and include tungsten.

With reference to FIG. 3K through FIG. 3O, the microelectronic device structure assembly 300 (FIG. 3F through FIG. 3J) may be further processed to form a microelectronic device 350 including a back end of line (BEOL) structure 310 vertically over (e.g., in the Z-direction) the second microelectronic device structure 200, such as vertically over the second control logic device region 221. The BEOL structure 310 may be formed in a seventh insulative material 320.

Figure 3K:
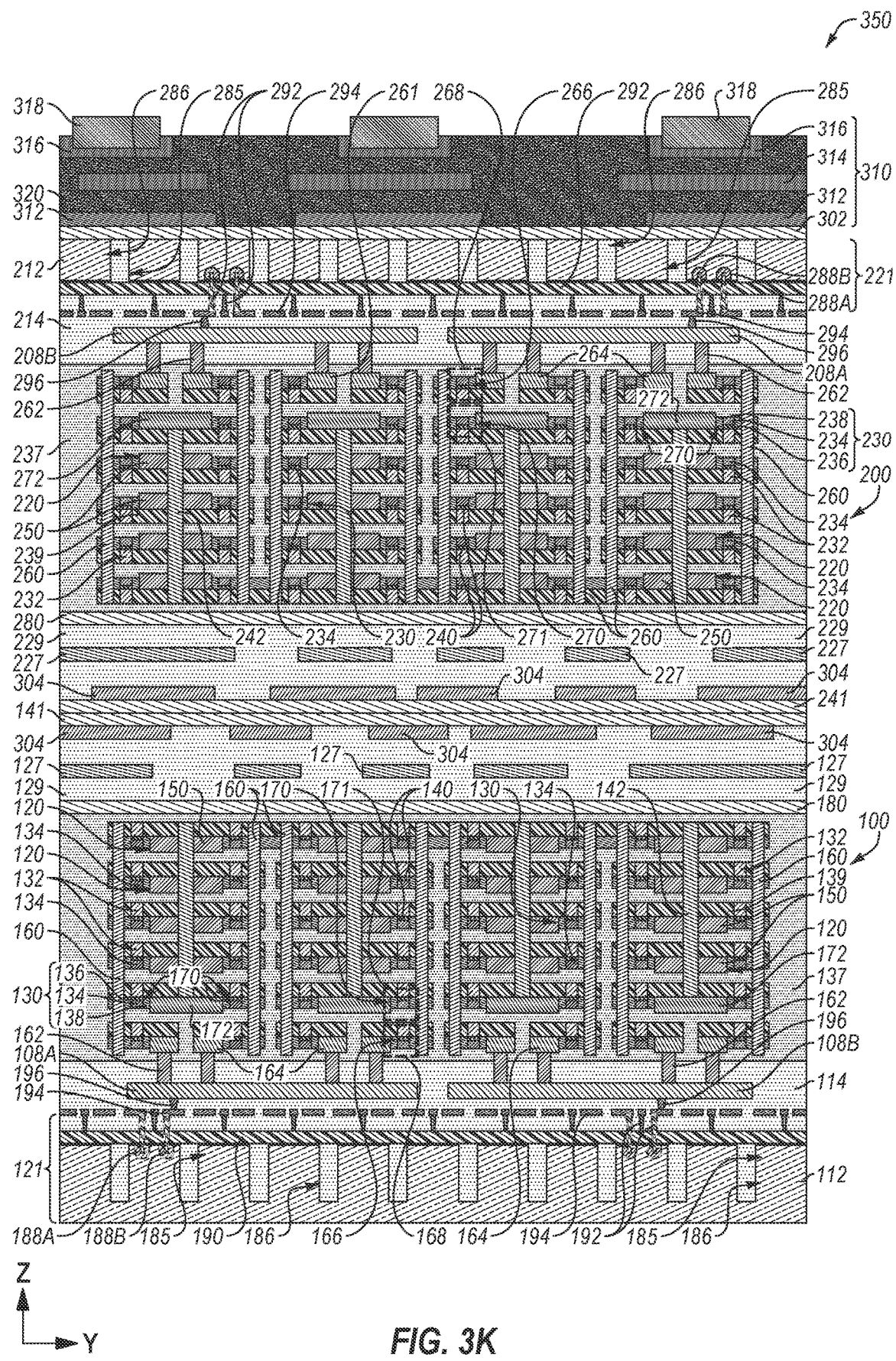
Figure 3L:
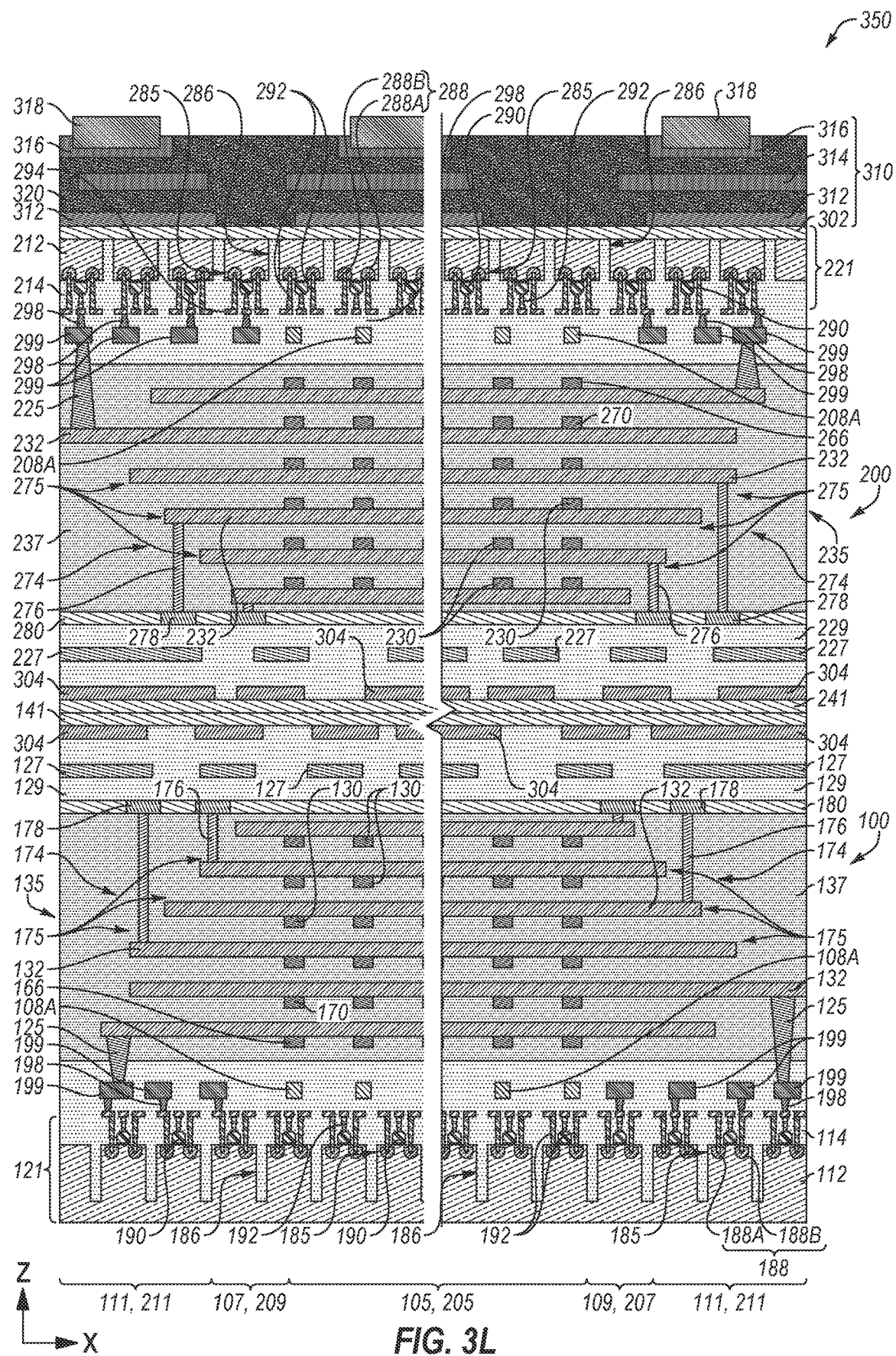
Figure 3M:
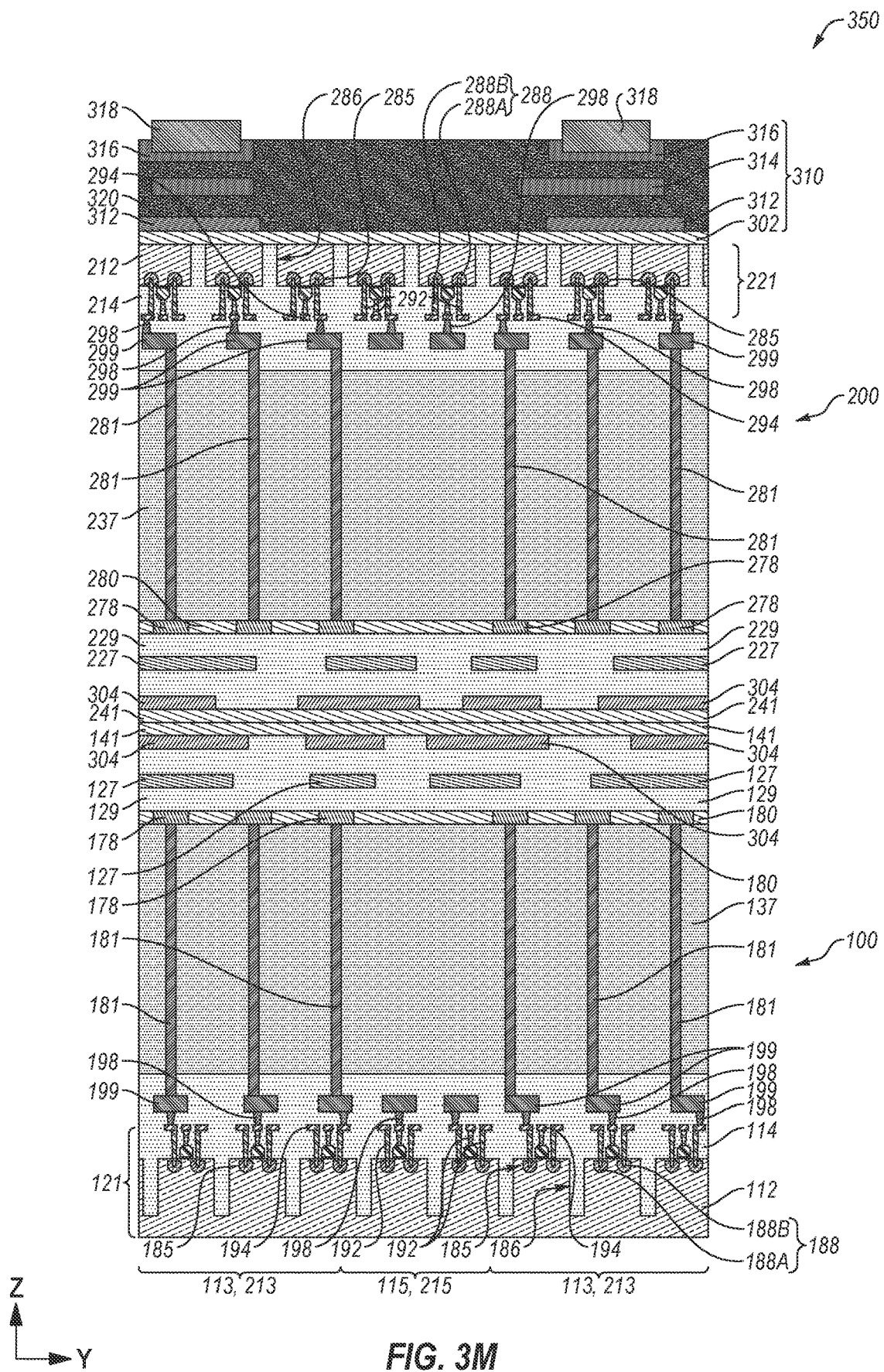

The cross-sectional view illustrated in FIG. 3K corresponds to the cross-sectional view of FIG. 3F; the cross-sectional view illustrated in FIG. 3L corresponds to the cross-sectional view of FIG. 3G; the cross-sectional view illustrated in FIG. 3M corresponds to the cross-sectional view of FIG. 3H; the cross-sectional view illustrated in FIG. 3N corresponds to the cross-sectional view of FIG. 3I; and the cross-sectional view illustrated in FIG. 3O corresponds to the cross-sectional view of FIG. 3J.

With collective reference to FIG. 3K through FIG. 3O, third pad structures 312 may be formed vertically over (e.g., in the Z-direction) the second control logic device region 221 on a side of the second microelectronic device structure 200 opposite the first microelectronic device structure 100. With reference to FIG. 3O, the third pad structures 312 in the input/output device region 219 may be in electrical communication with the eighth conductive interconnect structures 306.

The third pad structures 312 individually be formed of and include conductive material, such as one or more of the materials described above with reference to the first pad structures 184. In some embodiments, the third pad structures 312 are individually formed of and include tungsten. In other embodiments, the third pad structures 312 are individually formed of and include copper.

Conductive line structures 314 may be formed vertically over (e.g., in the Z-direction) the third pad structures 312, fourth pad structures 316 may be formed vertically over the conductive line structures 314, and conductive landing pad structures 318 may be formed in electrical communication with the fourth pad structures 316. In some embodiments, conductive interconnect structures vertically extend between and electrically connect at least some of the third pad structures 312 to at least some of the conductive line structures 314; and at least some of the conductive line structures 314 to at least some of the fourth pad structures 316.

Each of the conductive line structures 314, the fourth pad structure 316, and the conductive landing pad structures 318 are formed of and include conductive material. Each of the conductive line structures 314, the fourth pad structure 316, and the conductive landing pad structures 318 may individually be formed of and include tungsten. In other embodiments, each of the conductive line structures 314, the fourth pad structure 316, and the conductive landing pad structures 318 are individually be formed of and include copper. In yet other embodiments, each of the conductive line structures 314, the fourth pad structure 316, and the conductive landing pad structures 318 are individually be formed of and include aluminum.

The seventh insulative material 320 may be formed of and include insulative material, such as one or more of the materials described above with reference to the first insulative material 114. In some embodiments, the seventh insulative material 320 comprises silicon dioxide.

Accordingly, the microelectronic device 350 may include the first microelectronic device structure 100 comprising the first array region 101 including vertical stacks of memory cells 120 and the second microelectronic device structure 200 vertically above (e.g., in the Z-direction) the first microelectronic device structure 100 and comprising the second array region 201 including additional vertical stacks of memory cells 220. The microelectronic device structure assembly 300 includes the first microelectronic device structure 100 including the first control logic device region 121 comprising control logic devices configured to effectuate control operations for the memory cells 120 of the first microelectronic device structure 100 (e.g., including each of the first sense amplifier device region 105, the first column decoder region 107, the first sense amplifier driver region 109, the first multiplexer controller region 111, the one or more first sub word line driver regions 113, and the one or more first row decoder device regions 115) and the second microelectronic device structure 200 vertically over (e.g., in the Z-direction) the first microelectronic device structure 100 and including the second control logic device region 221 comprising control logic devices configured to effectuate control operations for the memory cells 220 of the second microelectronic device structure 200 (e.g., including each of the second sense amplifier device region 205, the second column decoder region 207, the second sense amplifier driver region 209, the second multiplexer controller region 211, the one or more second sub word line driver regions 213, and the one or more second row decoder device regions 215). Accordingly, the first microelectronic device structure 100 may include control logic devices configured to effectuate control operations for the memory cells 120 of the first microelectronic device structure 100 and the second microelectronic device structure 200 may include control logic devices configured to effectuate control operations for the memory cells 220 of the second microelectronic device structure 200.

Forming the microelectronic device 350 including the first microelectronic device structure 100 and the second microelectronic device structure 200 as described herein facilitates forming the microelectronic device 350 to have a greater number of levels of memory cells 120, 220 in a smaller horizontal footprint (e.g., in the X-direction, in the Y-direction) compared to conventional microelectronic devices. In some embodiments, vertically stacking (e.g., in the Z-direction) the first microelectronic device structure 100 and the second microelectronic device structure 200 facilitates forming a greater quantity of levels of memory cells 120, 220 within the horizontal boundaries (e.g., in the X-direction, in the Y-direction) of the first microelectronic device structure 100 and the second microelectronic device structure 200 with sufficient area for forming the first control logic device region 121 and the second control logic device region 221.

Thus, in accordance with some embodiments, a microelectronic device comprises a first microelectronic device structure comprising a first memory array region comprising vertical stacks of memory cells, each vertical stack of memory cells comprising a vertical stack of access devices operably coupled to a vertical stack of storage devices, and a first control logic device region comprising first control logic devices configured to effectuate control operations for the vertical stacks of memory cells. The microelectronic device further comprises a second microelectronic device structure vertically overlying the first microelectronic device structure and comprising a second memory array region comprising additional vertical stacks of memory cells, each additional vertical stack of memory cells comprising an additional vertical stack of access devices operably coupled to an additional vertical stack of storage devices, and a second control logic device region comprising second control logic devices configured to effectuate control operations for the additional vertical stacks of memory cells.

Furthermore, in accordance with additional embodiments of the disclosure, a memory device comprises a first die comprising vertical stacks of memory cells, a stack structure comprising conductive structures interleaved with insulative structures, at least some of the conductive structures in electrical communication with memory cells of the vertical stacks of memory cells, and a first control logic device region vertically neighboring the vertical stacks of memory cells and comprising sub word line drivers in electrical communication with the conductive structures. The microelectronic device further comprises a second die vertically overlying the first die and comprising additional vertical stacks of memory cells, an additional stack structure comprising additional conductive structures interleaved with additional insulative structures, at least some of the additional conductive structures in electrical communication with memory cells of the additional vertical stacks of memory cells, and a second control logic device region vertically neighboring the additional vertical stacks of memory cells and comprising second sub word line drivers in electrical communication with the additional conductive structures of the additional stack structure.

Moreover, in accordance with some embodiments of the disclosure, a method of forming a microelectronic device comprises forming a first microelectronic device structure comprising vertical stacks of memory cells, each vertical stack of memory cells comprising vertically spaced levels of memory cells, each level of memory cells comprising an access device operably coupled to a storage device, a first control logic device region vertically underlying the vertical stacks of memory cells and comprising first control logic devices configured to effectuate control operations for the vertical stacks of memory cells, and a first oxide material vertically overlying the vertical stack of memory cells. The method further comprises forming a second microelectronic device structure comprising additional vertical stacks of memory cells, each additional vertical stack of memory cells comprising vertical levels of memory cells, each level of memory cells comprising an additional access device operably coupled to an additional storage device, a second control logic device region vertically underlying the additional vertical stacks of memory cells and comprising second control logic devices configured to effectuate control operations for the additional vertical stacks of memory cells, and a second oxide material vertically overlying the additional vertical stack of memory cells. The method further comprises attaching the second microelectronic device structure to the first microelectronic device structure.

Figure 4:
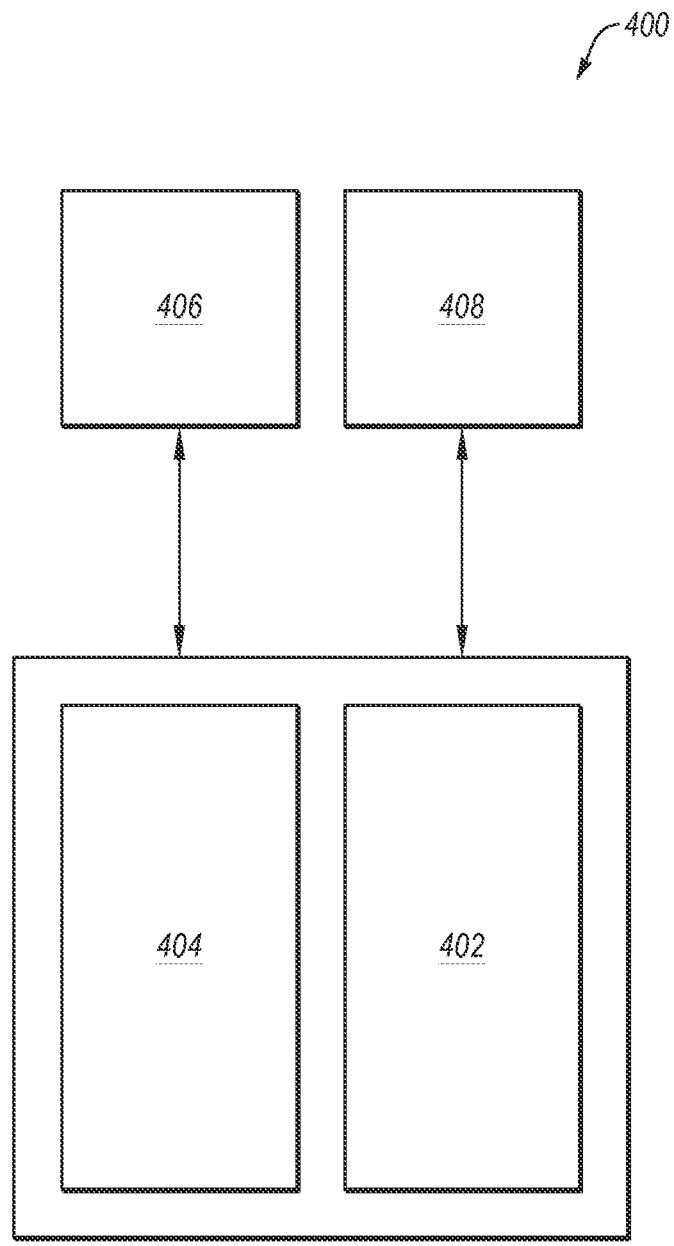
FIG. 4 is a schematic block diagram of an electronic system, in accordance with an embodiment of the disclosure.

Structures, assemblies, and devices in accordance with embodiments of the disclosure may be included in electronic systems of the disclosure. For example, FIG. 4 is a block diagram of an illustrative electronic system 400 according to embodiments of disclosure. The electronic system 400 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 400 includes at least one memory device 402. The memory device 402 may comprise, for example, an embodiment of one or more of a microelectronic device structure, a microelectronic device structure assembly, a relatively larger microelectronic device structure assembly, and a microelectronic device previously described herein with reference to FIG. 1A through FIG. 3O. The electronic system 400 may further include at least one electronic signal processor device 404 (often referred to as a "microprocessor"). The electronic signal processor device 404 may, optionally, include an embodiment of one or more of a microelectronic device structure, a microelectronic device structure assembly, a relatively larger microelectronic device structure assembly, and a microelectronic device previously described herein with reference to FIG. 1A through FIG. 3O. While the memory device 402 and the electronic signal processor device 404 are depicted as two (2) separate devices in FIG. 3, in additional embodiments, a single (e.g., only one) memory/processor device having the functionalities of the memory device 402 and the electronic signal processor device 404 is included in the electronic system 400. In such embodiments, the memory/processor device may include one or more of a microelectronic device structure, a microelectronic device structure assembly, a relatively larger microelectronic device structure assembly, and a microelectronic device previously described herein with reference to FIG. 1A through FIG. 3O. The electronic system 400 may further include one or more input devices 406 for inputting information into the electronic system 400 by a user, such as, for example, a mouse or other pointing device, a keyboard, a touchpad, a button, or a control panel. The electronic system 400 may further include one or more output devices 408 for outputting information (e.g., visual or audio output) to a user such as, for example, one or more of a monitor, a display, a printer, an audio output jack, and a speaker. In some embodiments, the input device 406 and the output device 408 may comprise a single touchscreen device that can be used both to input information to the electronic system 400 and to output visual information to a user. The input device 406 and the output device 408 may communicate electrically with one or more of the memory device 402 and the electronic signal processor device 404.

Thus, in accordance with embodiments of the disclosure, an electronic system comprises an input device, an output device, a processor device operably coupled to the input device and the output device, and a memory device operably coupled to the processor device. The memory device comprises a first die and a second die vertically overlying the first die. The first die comprises vertical stacks of dynamic random access memory (DRAM) cells, each DRAM cell comprising a storage device horizontally neighboring an access device, and a first control logic device region vertically underlying the vertical stacks of DRAM cells and comprising first control logic devices configured for effectuating control operations of the vertical stacks of DRAM cells. The second die comprises additional vertical stacks of DRAM cells, each DRAM cell of the additional vertical stacks of DRAM cells comprising an additional storage device horizontally neighboring an additional access device, and a second control logic device region vertically underlying the additional vertical stacks of DRAM cells and comprising second control logic devices configured for effectuating control operations of the additional vertical stacks of DRAM cells.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
a first microelectronic device structure comprising:
a first memory array region comprising vertical stacks of memory cells, each vertical stack of memory cells comprising a vertical stack of access devices operably coupled to a vertical stack of storage devices;
a first control logic device region vertically underlying the first memory array region and comprising first control logic devices configured to effectuate control operations for the vertical stacks of memory cells; and
a first insulative material vertically overlying the first memory array region; and
a second microelectronic device structure vertically overlying the first microelectronic device structure, the second microelectronic device structure comprising:
a second insulative material bonded to the first insulative material of the first microelectronic device structure;
a second memory array region vertically overlying the second insulative material and comprising additional vertical stacks of memory cells, each additional vertical stack of memory cells comprising an additional vertical stack of access devices operably coupled to an additional vertical stack of storage devices; and
a second control logic device region vertically overlying the second memory array region and comprising second control logic devices configured to effectuate control operations for the additional vertical stacks of memory cells.

2. The microelectronic device of claim 1, wherein the first control logic device region is located on a side of the first memory array region opposite the second microelectronic device structure.

3. The microelectronic device structure of claim 1, wherein a vertical distance between the first memory array region and the second memory array region is less than a vertical distance between the first control logic device region and the second control logic device region.

4. The microelectronic device of claim 1, wherein the second control logic device region comprises substantially the same type of control logic devices and circuitry as the first control logic device region.

5. The microelectronic device of claim 1, wherein the first control logic device region comprises a first sense amplifier region and a first sub word line driver region.

6. The microelectronic device of claim 5, wherein the second control logic device region comprises a second sense amplifier device region and a second sub word line driver region.

7. The microelectronic device of claim 1, further comprising a conductive contact structure vertically extending through the second microelectronic device structure and in electrical communication with complementary metal-oxide-semiconductor devices of the first microelectronic device structure.

8. The microelectronic device of claim 1, wherein the first memory array region further comprises conductive lines operably associated with the access devices of the vertical stack of access devices and extending in a horizontal direction, horizontal ends of the conductive lines defining staircase structures.

9. The microelectronic device of claim 8, further comprising conductive contact structures individually in electrical communication with one of the conductive lines at a step one of the staircase structures.

10. The microelectronic device of claim 9, wherein the first control logic device region comprises a sub word line driver in electrical communication with the conductive contact structures.

11. A microelectronic device, comprising:
a first die comprising:
vertical stacks of memory cells respectively comprising a conductive pillar structure vertically extending therethrough;
a stack structure comprising conductive structures interleaved with insulative structures, at least some of the conductive structures in electrical communication with memory cells of the vertical stacks of memory cells; and
a first control logic device region vertically neighboring the vertical stacks of memory cells and comprising:
sub word line drivers in electrical communication with the conductive structures; and
first sense amplifiers in electrical communication with global digit lines vertically intervening between the vertical stacks of memory cells and the first control logic device region, each global digit line in electrical communication with the conductive pillar structure of more than one of the vertical stacks of memory cells by means of a multiplexer individually between each of the global digit lines and the respective conductive pillar structure; and
a second die vertically overlying the first die, the second die comprising:
additional vertical stacks of memory cells;
an additional stack structure comprising additional conductive structures interleaved with additional insulative structures, at least some of the additional conductive structures in electrical communication with memory cells of the additional vertical stacks of memory cells; and
a second control logic device region vertically neighboring the additional vertical stacks of memory cells and comprising second sub word line drivers in electrical communication with the additional conductive structures of the additional stack structure.

12. The microelectronic device of claim 11, wherein a quantity of the memory cells of each vertical stack of memory cells is from 4 memory cells to 100 memory cells.

13. The microelectronic device of claim 11, wherein each of the vertical stacks of memory cells individually comprises:
a vertical stack of access devices; and
a vertical stack of storage devices horizontally neighboring the vertical stack of access devices, each access device of the vertical stack of access devices configured to be in electrical communication with a horizontally neighboring storage device of the vertical stack of storage devices.

14. The microelectronic device of claim 11, wherein a quantity of the vertical stacks of memory cells of the first die is equals a quantity of the additional vertical stacks of memory cells of the second die.

15. The microelectronic device of claim 11, further comprising a back end of line (BEOL) structure vertically overlying the second die and in electrical communication with complementary metal-oxide-semiconductor (CMOS) devices within the first die.

16. The microelectronic device of claim 11, wherein the second sub word line drivers of the second die are located within horizontal boundaries of a first sub word line drivers of the first die.

17. A method of forming a microelectronic device, the method comprising:
forming a first microelectronic device structure comprising:
vertical stacks of memory cells, each vertical stack of memory cells comprising vertically spaced levels of memory cells, each level of memory cells comprising an access device operably coupled to a storage device;
a first control logic device region vertically underlying the vertical stacks of memory cells and comprising first control logic devices configured to effectuate control operations for the vertical stacks of memory cells;
forming global digit lines vertically intervening between the vertical stacks of memory cells and the first control logic device region; and
a first oxide material vertically overlying the vertical stack of memory cells;
forming a second microelectronic device structure comprising:
additional vertical stacks of memory cells, each additional vertical stack of memory cells comprising vertical levels of memory cells, each level of memory cells comprising an additional access device operably coupled to an additional storage device;
a second control logic device region vertically underlying the additional vertical stacks of memory cells and comprising second control logic devices configured to effectuate control operations for the additional vertical stacks of memory cells; and
a second oxide material vertically overlying the additional vertical stack of memory cells; and
attaching the second microelectronic device structure to the first microelectronic device structure.

18. The method of claim 17, wherein attaching the second microelectronic device structure to the first microelectronic device structure comprises forming oxide-to-oxide bonds between the second oxide material and the first oxide material.

19. The method of claim 17, wherein attaching the second microelectronic device structure to the first microelectronic device structure comprises horizontally aligning the first control logic device region with the second control logic device region.

20. The method of claim 19, wherein forming the first microelectronic device structure comprises forming the first control logic device region to comprise sense amplifier devices in electrical communication with the global digit lines.

21. The method of claim 19, wherein forming the first microelectronic device structure comprises electrically connecting each global digit line to at least four vertical stacks of memory cells.

22. The method of claim 17, wherein forming the first microelectronic device structure comprises forming the vertical stacks of memory cells to vertically extend through at least one stack structure, the at least one stack structure comprising conductive structures each vertically spaced from a respective one of the access devices of the vertical stacks of memory cells.

23. The method of claim 22, wherein forming the first microelectronic device structure comprises forming the first control logic device region to comprise sub word line drivers horizontally spaced from staircase structures comprising steps defined by the conductive structures.

24. An electronic system, comprising:
   an input device;
   an output device;
   a processor device operably coupled to the input device and the output device; and
   a memory device operably coupled to the processor device and comprising:
      a first die comprising:
         vertical stacks of dynamic random access memory (DRAM) cells, each DRAM cell comprising a storage device horizontally neighboring an access device; and
         a first control logic device region vertically underlying the vertical stacks of DRAM cells and comprising first control logic devices configured for effectuating control operations of the vertical stacks of DRAM cells; and
      a second die vertically overlying the first die, the second die comprising:
         additional vertical stacks of DRAM cells, each DRAM cell of the additional vertical stacks of DRAM cells comprising an additional storage device horizontally neighboring an additional access device; and
         a second control logic device region vertically underlying the additional vertical stacks of DRAM cells and comprising second control logic devices configured for effectuating control operations of the additional vertical stacks of DRAM cells.

25. The electronic system of claim 24, wherein the first die further comprises conductive pillar structures vertically extending through the access devices of the vertical stacks of DRAM cells.

26. The electronic system of claim 25, further comprising a global digit line configured to be in electrical communication with the conductive pillar structures.

27. The electronic system of claim 26, further comprising a multiplexer individually between the global digit line and each of the conductive pillar structures.

28. The electronic system of claim 24, wherein:
   the first control logic device region comprises a first sense amplifier device region and a first sub word line driver region; and
   the second control logic device region comprises a second sense amplifier device region and a second sub word line driver region.

* * * * *